(12) United States Patent
Reid

(10) Patent No.: US 6,567,087 B1
(45) Date of Patent: May 20, 2003

(54) METHOD TO CREATE A HIGH RESOLUTION DATABASE

(75) Inventor: Alexander A. Reid, Washington, MI (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/537,165

(22) Filed: Mar. 27, 2000

(51) Int. Cl.[7] .............................................. G06T 17/00

(52) U.S. Cl. ........................... 345/428; 345/619; 703/2

(58) Field of Search ...................... 703/214; 382/270; 711/211, 213; 345/419, 423, 426, 420, 421, 428, 440, 606, 619

(56) References Cited

U.S. PATENT DOCUMENTS

| | | | | |
|---|---|---|---|---|
| 5,054,101 A | * | 10/1991 | Prakash | 382/270 |
| 5,416,848 A | * | 5/1995 | Young | 345/441 |
| 5,995,903 A | * | 11/1999 | Smith et al. | 701/211 |

OTHER PUBLICATIONS

Fournier et al ("Computer Rendering of Stochastic Models": 1982 ACM 0001–0782/82/0600–0371).*

Szeliski et al ("From Splines to Fractals": 1989 ACM–0–89791–312–4/89/007/0051).*

* cited by examiner

*Primary Examiner*—Mano Padmanabhan
(74) *Attorney, Agent, or Firm*—David L. Kuhn; Clifford C. Carter; Gail S. Soderling

(57) ABSTRACT

A new method of creating a realistic simulated terrain database results in a database that requires less computer memory for storage than prior simulated terrain databases. The new method generates a simulated surface that provides realistic disturbances to a real-time mathematical model of a vehicle traversing the simulated surface. The simulated surface is also output visually. The method uses fractal Brownian motion to create the high-resolution terrain database in the frequency domain, and then the database is transformed to the spatial domain using a two-dimensional inverse Fast Fourier Transform. Then control points describing a NURBS surface are extracted from the transformed database, and thereafter geometric $G^1$ continuity is created between surface patches represented by the NURBS control points. The surface patches form a high-resolution surface superimposed on a lower resolution surface produced by the image generator to create a hybrid, high-resolution simulated terrain. The hybrid simulated terrain interacts with the vehicle model to provide a realistic experience to a human driver navigating the vehicle model over the terrain.

1 Claim, 16 Drawing Sheets

N=8

| $a_{1,1}$ | $a_{1,2}$ | $a_{1,3}$ | $a_{1,4}$ | $a_{1,5}$ | $a_{1,4}^*$ | $a_{1,3}^*$ | $a_{1,2}^*$ |
|---|---|---|---|---|---|---|---|
| $a_{2,1}$ | $a_{2,2}$ | $a_{2,3}$ | $a_{2,4}$ | $a_{2,5}$ | $a_{2,6}$ | $a_{2,7}$ | $a_{2,8}$ |
| $a_{3,1}$ | $a_{3,2}$ | $a_{3,3}$ | $a_{3,4}$ | $a_{3,5}$ | $a_{3,6}$ | $a_{3,7}$ | $a_{3,8}$ |
| $a_{4,1}$ | $a_{4,2}$ | $a_{4,3}$ | $a_{4,4}$ | $a_{4,5}$ | $a_{4,6}$ | $a_{4,7}$ | $a_{4,8}$ |
| $a_{5,1}$ | $a_{5,2}$ | $a_{5,3}$ | $a_{5,4}$ | $a_{5,5}$ | $a_{5,4}^*$ | $a_{5,3}^*$ | $a_{5,2}^*$ |
| $a_{4,1}^*$ | $a_{4,8}^*$ | $a_{4,7}^*$ | $a_{4,6}^*$ | $a_{4,5}^*$ | $a_{4,4}^*$ | $a_{4,3}^*$ | $a_{4,2}^*$ |
| $a_{3,1}^*$ | $a_{3,8}^*$ | $a_{3,7}^*$ | $a_{3,6}^*$ | $a_{3,5}^*$ | $a_{3,4}^*$ | $a_{3,3}^*$ | $a_{3,2}^*$ |
| $a_{2,1}^*$ | $a_{2,8}^*$ | $a_{2,7}^*$ | $a_{2,6}^*$ | $a_{2,5}^*$ | $a_{2,4}^*$ | $a_{2,3}^*$ | $a_{2,2}^*$ |

| $\alpha_{1.1}$ | $\alpha_{1.2}$ | $\alpha_{1.3}$ | $\alpha_{1.4}$ | $\alpha_{1.5}$ | $\alpha_{1.4}^*$ | $\alpha_{1.3}^*$ | $\alpha_{1.2}^*$ |
|---|---|---|---|---|---|---|---|
| $\alpha_{2.1}$ | $\alpha_{2.2}$ | $\alpha_{2.3}$ | $\alpha_{2.4}$ | $\alpha_{2.5}$ | 0 | 0 | 0 |
| $\alpha_{3.1}$ | $\alpha_{3.2}$ | $\alpha_{3.3}$ | $\alpha_{3.4}$ | $\alpha_{3.5}$ | 0 | 0 | 0 |
| $\alpha_{4.1}$ | $\alpha_{4.2}$ | $\alpha_{4.3}$ | $\alpha_{4.4}$ | 0 | 0 | 0 | 0 |
| $\alpha_{5.1}$ | $\alpha_{5.2}$ | $\alpha_{5.3}$ | 0 | 0 | 0 | $\alpha_{5.3}^*$ | $\alpha_{5.2}^*$ |
| $\alpha_{4.1}^*$ | 0 | 0 | 0 | 0 | $\alpha_{4.4}^*$ | $\alpha_{4.3}^*$ | $\alpha_{4.2}^*$ |
| $\alpha_{3.1}^*$ | 0 | 0 | 0 | $\alpha_{3.5}^*$ | $\alpha_{3.4}^*$ | $\alpha_{3.3}^*$ | $\alpha_{3.2}^*$ |
| $\alpha_{2.1}^*$ | 0 | 0 | 0 | $\alpha_{2.5}^*$ | $\alpha_{2.4}^*$ | $\alpha_{2.3}^*$ | $\alpha_{2.2}^*$ |

SPECTRAL SURFACE AFTER LOW-PASS FILTERING

*Fig. 5*

| | | | | | | | |
|---|---|---|---|---|---|---|---|
| 0 | 0 | $a_{1.3}$ | $a_{1.4}$ | $a_{1.5}$ | $a_{1.4}^*$ | $a_{1.3}^*$ | 0 |
| 0 | 0 | $a_{2.3}$ | $a_{2.4}$ | $a_{2.5}$ | 0 | 0 | 0 |
| $a_{3.1}$ | $a_{3.2}$ | $a_{3.3}$ | $a_{3.4}$ | $a_{3.5}$ | 0 | 0 | 0 |
| $a_{4.1}$ | $a_{4.2}$ | $a_{4.3}$ | $a_{4.4}$ | 0 | 0 | 0 | 0 |
| $a_{5.1}$ | $a_{5.2}$ | $a_{5.3}$ | 0 | 0 | 0 | $a_{5.3}^*$ | $a_{5.2}^*$ |
| $a_{4.1}^*$ | 0 | 0 | 0 | 0 | $a_{4.4}^*$ | $a_{4.3}^*$ | $a_{4.2}^*$ |
| $a_{3.1}^*$ | 0 | 0 | 0 | $a_{3.5}^*$ | $a_{3.4}^*$ | $a_{3.3}^*$ | $a_{3.2}^*$ |
| 0 | 0 | 0 | 0 | $a_{2.5}^*$ | $a_{2.4}^*$ | $a_{2.3}^*$ | 0 |

SPECTRAL SURFACE AFTER HIGH-PASS AND LOW-PASS FILTERING

Fig. 6

TRUNCATED PYRAMID CONTROL
POINT FILTERING

TRUNCATED PYRAMID WITH TRENCH
CONTROL POINT FILTERING

CONTROL POINT MANIPULATION
PATTERN FOR LARGE SURFACE

LOW-RESOLUTION IMAGE GENERATOR SURFACE

NURBS G⁰ CONTROL POINTS

NURBS G⁰ SURFACE

NURBS G¹ CONTROL POINTS

NURBS G¹ SURFACE

METHOD TO CREATE A HIGH RESOLUTION DATABASE

GOVERNMENT USE

The invention described here may be made, used and licensed by, or for, the U.S. Government for governmental purposes without paying me any royalty.

BACKGROUND

For decades, military establishments all over the world have used mechanical surrogates of real vehicles as part of simulated environments where human operators are trained to operate vehicles under combat or mission conditions. Perhaps the classic example of such a surrogate is a flight simulator which surrounds the flight crew and emulates the motion and environment of a cock pit. With respect to ground vehicle simulation, much research has been done by the United States Army. In particular, the US Army Tank-Automotive and Armaments Research, Engineering and Development Center (TARDEC) has been performing high-fidelity, real-time, man-in-the-loop simulations for a number of years. My invention is a method of generating a simulated terrain database that enhances TARDEC's simulation technology.

TARDEC's simulations are real-time in the sense that a computer's simulation clock is slaved to actual time, i.e., one second of simulation time on a computer takes one second to complete, no more, no less. TARDEC has integrated high-fidelity motion bases with a computer image generator (an Evans & Sutherland ESIG®-HD/3000 and a Harmony® image generator) and an audio generation system (AudioWorks 2™). This laboratory enhancement allows TARDEC to conduct soldier-in-the-loop testing to analyze the performance of new equipment, and just as importantly, to determine how effectively the soldier can use it in a simulated battlefield environment. TARDEC currently has two six-degree-of-freedom motion-based simulators. One is the Crew Station/Turret Motion Base Simulator (CS/TMBS), which has a bandwidth of ≈10 Hz and a payload capacity of greater than 25 tons. The CS/TMBS is built to handle complete turret systems as well as experimental crew stations. The CS/TMBS has a motion envelope of ±30 inches in translational motion (the x, y and z axes) and ±18° of rotational motion (roll, pitch and yaw). TARDEC's other motion-based simulator is the Ride Motion Simulator (RMS), a six degree-of-freedom simulator similar to the CS/TMBS but designed for a single crew member. The RMS has a vertical displacement of ±20 inches and ±10 inches in the horizontal (x and y) directions along with a rotational displacement of ±20° in roll, pitch and yaw. The RMS also has a bandwidth approaching 40 Hz in the vertical and 20 Hz in x and y. This simulator features an easily reconfigurable cab which will lend itself to quick experimental changes and re-testing. Both simulators' movements are controlled by real time mathematical models describing the dynamic characteristics of the particular vehicle being tested. These models receive inputs from a human driver (acceleration, steering, etc.) and reproduce accurate motion disturbances that the crew would feel.

TARDEC uses dynamic models in vehicle simulation techniques. A dynamic model is a mathematical representation of the vehicle being simulated running on a real-time computer. It is constructed using computer-based dynamics modeling and simulation algorithms tailored for real-time use. The model accurately incorporates characteristics of the suspension system, wheels or tracks, propulsion, weapon-stabilization system, etc. To accomplish its computer modeling, TARDEC has developed a real-time modeling methodology dubbed Symbolically Optimized Vehicle Analysis System (SOVAS) used to model high-fidelity dynamic systems. SOVAS is a methodology based in traditional C or FORTRAN language constructs and portable to many computer platforms. Currently, the SOVAS models are run over digitized test courses that the Army uses to baseline vehicle systems. These include test areas at the Aberdeen Proving Grounds, Yuma Proving Grounds, Ft. Knox and the Waterways Experiment Station. These courses are digitized to a resolution of 12 inches and are basically a dedicated path, meaning the model is not allowed to wander at will in any direction, but is slaved to a specified path through the test course. In this scenario, the inputs to the SOVAS model are velocity and braking.

The image generators mentioned above use a visual database to provide images to the user. The visual database uses a polygonal grid as its foundation such as that shown in FIG. 1. The grid is usually broken into triangles to guarantee polygonal planarity. To provide realism, the database is populated with various objects (trees, buildings, roads, etc.) and techniques such as Gouraud shading (Phong illumination in the latest image generators) and texture mapping are applied. The image generator's terrain database is created from terrain-position points and elevations stored in a digital format. The most common method of collecting and storing large terrain areas is to use the Digital Terrain Elevation Data (DTED) format, developed by the United States Government's Defense Mapping Agency. A limitation of DTED formatting is that it does not provide for terrain sampling at lower than 30 meter intervals. However, all image generators have polygonal output limitations since only so many polygons can be rendered in a frame. A quicker update rate (how fast the frame information changes) lowers the number of polygons that can be displayed. So, even though visual databases can be constructed with finer resolution than 30-meter intervals, rendering these databases is not practical or possible in real time.

TARDEC has incorporated the SOVAS dynamic model with the image generator. This allows for three degree-of-freedom user controlled movement of the model (x, y, yaw), with disturbances being calculated in the remaining degrees-of-freedom (z, roll, pitch). User inputs to the dynamic model now include steering as well as velocity and braking. The terrain the dynamic model is traveling over is the visual terrain database of the image generator. The terrain disturbance inputs to the dynamic model from the image generator are returned in one of two ways: 1) as a height-of-terrain value, or 2) as a planar equation (Ax+By+Cz+D=0) representing the equation of the terrain polygon the dynamic model is currently on.

However, either method is wrought with many problems. Mainly, as mentioned earlier, the resolution of the image generator's database is very low (between 30 m and 100 m). As an input to the dynamic model, it is equivalent to driving over a flat road. This defeats the purpose of a cross-country simulation, where terrain roughness may range from relatively mild (paved or unpaved road) to severe. Also, this method provides only geometric $G^0$ continuity. This first derivative is not continuous or is even geometrically discontinuous at polygon boundaries as shown at polygonal boundary 2 in FIG. 2. As an input to a mathematical system, this $G^0$ continuity will pose difficulty for mathematical integrators.

One method used to overcome these problems is to have a correlated terrain database sampled at a higher resolution to provide the higher frequency disturbances to the dynamic model. For example, the University of Iowa has developed a Virtual Proving Ground which uses this method, but the principal use of their driving simulator is for on-road conditions. The suspension system of the vehicle is used as a low-pass filter to help overcome the $G^0$ continuity problem. Other methods include simply introducing random high-frequency disturbances into the motion base directly or summing it with the image generator's database as an input to the dynamic model. While the Iowa method has merit, it has not totally solved the continuity problem. It was also developed at a time when computer power was much less than it is now, so calculations were minimized to a degree that is no longer necessary. Other methods involving random high-frequency disturbances exist and are known, but these methods are non-deterministic and unacceptable.

SUMMARY OF THE INVENTION

My invention is a method to create a high-resolution terrain database correlated to a computer image generator's low-resolution terrain database such as that provided by the ESIG®-HD/3000 or Harmony® generators. The high-resolution terrain database is comprised of a multiplicity of high-resolution surface patches that are overlaid upon the generator's lower-resolution database. The resulting hybrid terrain database has the following characteristics:

1. $G^1$ continuity throughout the entire terrain. $G^1$ continuity occurs when the patches adjoin one another at common boundaries and any two adjoining patches share a common normal vector at each point along their common boundary.
2. Infinite resolution across the terrain database (a continuous surface).
3. Data storage needed to represent this terrain is held to a minimum.
4. The frequency content and rms (root-mean-square) magnitude of the terrain database is user selectable.

Each patch is created using fractional Brownian motion approximated by spectral synthesis. After performing the proper filtering according to a user-defined frequency content range, a 2-D inverse Fast Fourier Transform is used to transform each patch of the surface to the spatial domain. Scaling is then performed to create a surface with the proper magnitude in terms of rms (root-mean-square) value. Then specific data points are extracted from the patches of the high-resolution surface at a sampling rate small enough to properly recreate the highest frequency content specified by the user. These data points are used as the control points in a NURBS (Non-Uniform Rational B-Splines) surface patch. These control points define the rough outline of the surface which lies within a convex hull defined by the control points. This set of control points are then overlaid upon the corresponding lower-fidelity terrain polygons, thus creating the correlated high-resolution terrain database. The correlated database may be regarded as a hybrid terrain database comprised of the image generator's terrain database modified by surface patches.

To ensure that the newly created terrain surface follows closely to the visual database, the control points are filtered. This gives the newly created surface a vertical offset of zero with respect to the polygonal boundaries of the generator's lower-fidelity terrain. This means that the high-fidelity surface patches will have the same height as the lower-fidelity surface at the polygon edges of the lower-fidelity surface. In this manner, a terrain database with $G^2$ continuity over most of the database and $G^0$ continuity at polygonal boundaries is created. Finally, the NURBS surface patches are modified at the surface patch boundaries to create $G^1$ continuity among the patches.

BRIEF DESCRIPTION OF THE DRAWINGS

FIG. 4 is an example of a spectral array of sampling points generated in the first overall step of my method of producing a high-fidelity simulated terrain database.

FIG. 5 is the array of FIG. 4 after low-pass filtering has been performed.

FIG. 6 is the array of FIG. 5 after high-pass filtering has been performed.

DETAILED DESCRIPTION

Figure 3:
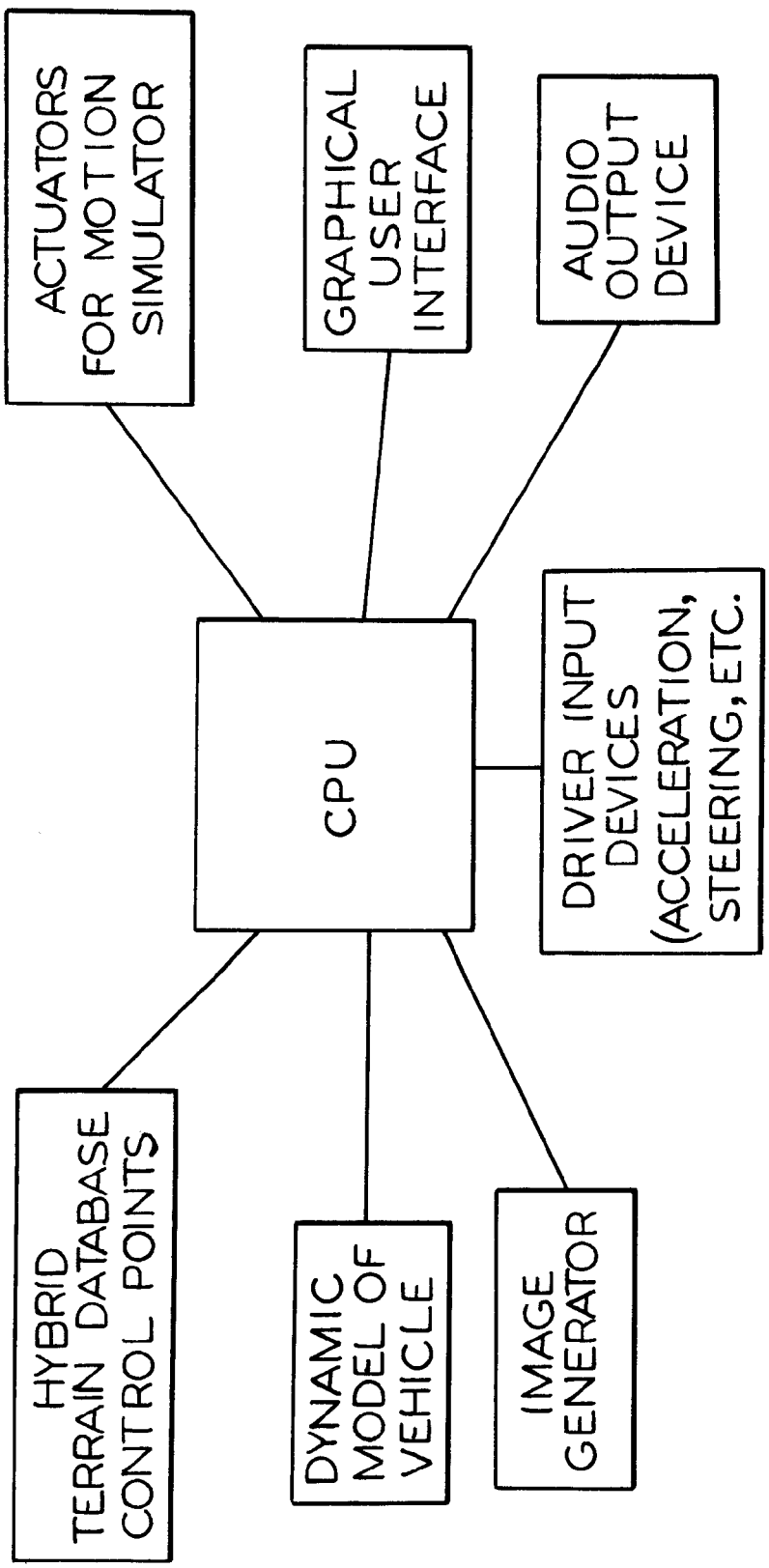
FIG. 3 is a diagram of the environment in which my terrain database is used.

FIG. 3 shows the environment in which the hybrid, high-fidelity terrain database will be used. There, a dynamic mathematical model 20 of the vehicle to be emulated is accessed by a computer's CPU 22. The CPU also accesses input from image generator 24 and the hybrid terrain database 28, which can be stored in the computer's memory. A human driver manipulates input devices 26 that effect virtual steering, acceleration and braking of the dynamic model of the vehicle. One result of the driver's inputs is that the vehicle model travels to and upon different zones of the terrain represented by database 28 as directed by the driver. At a given moment, only a portion of the control points of database 28 is used to generate a terrain surface and a visual representation thereof. That portion of the control points corresponds to the zone of the terrain surface where the vehicle model is at the given moment. The CPU does the necessary calculations on that portion of the control points to convert these points into a simulated terrain surface and the corresponding visual representation. The control points are a very efficient way of representing a large-area terrain, whereby a database for a large terrain area of, say 100 km by 100 km, can be stored in a computer. The CPU controls actuators 30 for the motion simulator in response to inputs from database 28, dynamic model 20 image generator 24 and driver input devices 26. Using the same inputs, the CPU controls graphical user interface 32, which typically includes a set of screens representing the viewing ports of a vehicle by which the driver views the simulated terrain. The CPU also controls audio output device 34.

The first step in creating my high-resolution database is to create sets of points that lie on spectral fractal Brownian surfaces that will become surface patches in the spatial domain. Three-dimensional spectral fractal geometry is used in the generation of the surface patches because it lends itself well to creating random surfaces. To create these arrays, one may first refer to the following discrete two-dimensional Fourier transform:

$$F(u,v) = \frac{1}{MN} \sum_{x=0}^{M-1} \sum_{y=0}^{N-1} f(x,y) e^{-j\left(\frac{ux}{M} + \frac{vy}{N}\right)} \quad (1)$$

where f(x,y) represents a fractal Brownian surface in the spatial domain along the x and y axes, M samples are taken along the x axis and N samples are taken along the y axis, and F(u,v) represents the fractal Brownian surface in the spectral domain along the u and v axes. If, as I prefer in my method, x and y are sampled equally in a square array with size M=N, the above relationship simplifies to:

$$F(u,v) = \frac{1}{N} \sum_{x=0}^{N-1} \sum_{y=0}^{N-1} f(x,y) e^{-j(ux+vy)/N} \quad (2)$$

The two-dimensional Fourier series of equation (2) can be used to implement an algorithm to calculate values for points on spectral Brownian surfaces. To do so, let phase (the term $e^{-j(ux+vy)/N}$ in equation (2)) be a random number between 0 and $2\pi$. Also, for each point in the M×M array, let the amplitude (the term f(x,y) in equation (2)) be a different random number from a Gaussian distribution multiplied by the scaling factor $$\sqrt{1/(u^2+v^2)^{H+1}}$$

where the particular values for u and v at any given point are used for the scaling factor of that point, and H is the Hurst exponent.

Alternatively to equation (2), I prefer to use a trigonometric form of equation (1), which is:

$$F(u,v) = \frac{1}{MN} \sum_{x=0}^{M-1} \sum_{y=0}^{N-1} a_{u,v}(\cos \omega + j\sin \omega). \quad (3)$$

where $$\omega = 2\pi\left(\frac{ux}{M} + \frac{vy}{N}\right).$$

Here, $a_{u,v}$ is a random number from a Gaussian distribution multiplied by the scaling factor $$\sqrt{1/(u^2+v^2)^{H+1}}$$

and the phase, $\omega$, is a uniform random number between 0 and $2\pi$.

As is known, H relates to the degree of fluctuation where a function or phenomenon exhibits random variations. For simple Brownian motion, H=½. For fractional Brownian motion generally, which includes spectral fractal Brownian motion, $1 \leq H \leq 0$. As can be gleaned by observing the above scaling factor, the degree of fluctuation decreases as H increases in value, so that the roughness of a spectral fractal Brownian surface diminishes as H approaches 1. The Hurst component is related to the fractal dimension, D, which is a measure of complexity based on how fast length, surface or volume changes when measured with progressively finer scales. In the spatial domain, the Hurst exponent and the fractal dimension of a surface are related by the equation $$D=3-H. \quad (4)$$

For a spatially generated fractal surface, D is defined in the range $2 \leq D \leq 3$, with a value of D=2 generating a flat surface and a value of D=3 generating a surface approaching white noise. The aforementioned scaling factor thus can be rewritten as $$\sqrt{1/(u^2+v^2)^{4-D}}$$

and it can be seen that surface roughness increases with the fractal dimension. In the spectral domain, D has no upper and lower limits, D=4 represents a surface having white noise, D<4 gives a smoother surface and D>4 gives a rougher surface. As in the spatial domain, surface roughness increases with higher values of D. In either domain, the scaling factor has a tendency to act as a high-pass filter in the sense that D or H affects the maximum frequency values of u or v which have an appreciable affect on surface topography. A user of my method selects the fractal dimension as an input or alternatively the user selects the Hurst exponent, the respective value depending on the desired roughness of the terrain surface to be generated.

Other variables selected by the user are the maximum and minimum frequencies to be used in generating the terrain database or alternatively, the minimum and maximum wavelengths to be used. Inclusion of higher frequencies tends to give greater resolution, or fineness of detail, to the terrain represented by the database. However, given that the scaling factor will increasingly reduce the effect of successively higher frequencies, it is sensible to exclude frequencies above a certain level for the sake of computational economy, depending upon the desired level of resolution. For example, very small variations in terrain topography may be superfluous in simulations of a heavy combat vehicle interacting with the terrain. Likewise, as frequencies lower, they tend to introduce gradients in terrain so slight that they do not affect the vehicle performance modeled on that terrain. Thus it may be desirable to eliminate these frequencies below a chosen threshold for the sake of computational economy.

A further implication of the choice of maximum frequency or minimum wavelength is that this frequency Or wavelength affects the number of samples of F(u, v) from equation (3) that are needed to properly define a surface containing the chosen frequency range. The number of sampling points along the u vector and the v vector is chosen according to the Nyquist sampling criteria. To properly sample and reproduce a signal according to that criteria, the signal must be sampled at a rate at twice that of the its highest frequency component. Accordingly, in my method, the spatial sampling step size is no more than half the minimum wavelength used in generating a particular terrain surface. For a square array in the spatial domain having a side length l, the number of columns, N, and the number of rows, M, are related to sample step size by the formulae $$\Delta x = \frac{1}{M} \text{ and } \Delta y = \frac{1}{N} \quad (5)$$

where $\Delta x$ is the spatial sampling step size in the x direction and $\Delta y$ is the spatial sampling step size in the y direction, M is the number of columns in the array and N is the number of rows in the array. Per the Nyquist criteria, $\Delta x$ and $\Delta y$ will be one-half the selected minimum wavelength. Of course, since the array is square, M=N and the number of samples is $N^2$. The side length, l, of the array is chosen according to the desired area size of the terrain unit to be generated. I prefer to increase the value of $N^2$ to the nearest power of 2. Thus if $N^2$ is 49, I increase $N^2$ to 64, or $2^6$. It is not necessary that $N^2$ be a power of 2, but a power of 2 is more efficient for Fast Fourier Transform algorithms, which are used at a later stage of my method. An example of a spectral array of sampling points is seen in FIG. 4, which shows F(u,v) for an array A in the spectral domain, where N=8. Note that the corner points of A ($a_{1,1}, a_{1,N/2+1}, a_{M/2+1}$ and $a_{M/2+1,N/2+1}$) are real numbers. When the inverse 2-D Fast Fourier Transform is applied, the real numbers at the corner points of array A prevent the resulting spatial array from being complex.

For computer programming purposes, the following pseudocode will create any array A representing a spectral surface, using Equation (3) above:

```
// Create the first quadrant of the array
for i = 0 to M/2
    for j = 0 to N/2
        rand = Gaussian random number
        randn = uniform random number between 0 and 1
        if (ii ≠ 0 OR jj ≠ 0) then
            mag = rand * (ii^2 + jk^2) ^ - ((H+1)/2)
        else
            mag = 0
        end
        phase = 2.0 * pi * randn
        A[ii] [jj] = mag * cos(phase) + j * mag * sin(phase)
        // Create the imaginary frequencies
        if (ii == 0)
            i0 = 0
        else
            i0 = M - ii
        end
        if (jj == 0)
            j0 = 0
        else
            j0 = N - jj
        end
        A[i0] [j0] = mag * cos(phase) - j * mag * sin(phase)
    end
end
// Set the Nyquist corner frequencies to real numbers
```

-continued

```
A[M/2] [0] = real (A[M/2] [0])
A[0] [N/2] = real (A[0] ]N/2])
A[M/2] [N/2] = real (A[M/2] [N/2]
// Finish the last quadrant
for ii = 0 to M/2-1
    for jj = Q to N/2-1
        phase = 2.0 * pi * randn
        mag = rand * (ii^2 + jk^2) ^ -((H+1)/2)
        A[ii] [N-jj] = mag * cos(phase) + j * mag * sin(phase)
        A[M-ii] [jj] = mag * cos (phase) - j * mag * sin(phase)
    end
end
```

Filtering

Once the spectral representation of the surface F(u,v) exists, filtering is done to bring the frequency content into conformity with the user's specified minimum and maximum frequencies, $\omega_L$ and $\omega_H$ respectively. The high-pass filter breakpoint, $\omega_L$, and the low-pass filter breakpoint, $\omega_H$, are derived from $\lambda_{max}$ and $\lambda_{min}$ by:

$$\omega_L = \frac{2\pi}{\lambda_{max}} \text{ and } \omega_H = \frac{2\pi}{\lambda_{min}} \quad (6)$$

First, let low pass filtering be performed, thus removing all components of F(u,v) that have a frequency value greater than $\omega_H$. While many filtering techniques exist, the simplest is rectangular filtering, where all the frequency components above $\omega_H$ (and their corresponding complex conjugates) are set to 0. While this method of filtering will introduce a ringing effect when the 2-D Fast Fourier Transform is done, this is not important because as NURBS control points are extracted during a later step in my method, this ringing is simply a minor random shift in the control points' z value. Using the most common case where the length of each side of the surface is equal and the number of samples in each direction are the same (M=N), $\Delta x=\Delta y$ and $\Delta u+\Delta v$. The natural frequency, $\omega_a$, of an element $a_{ij}$ in the array A, which represents F(u,v), then is given by:

$$\omega_a = \Delta u \sqrt{(i-1)^2 + (j-1)^2} \quad (7)$$

As an example of low-pass filtering, if $\omega_H=4.9\Delta u$, FIG. 5 shows the resultant matrix. Note that the imaginary frequencies are also set to 0 for frequency values that are removed. The following pseudocode will perform the low pass filtering:

```
//     Perform low-pass filtering
    for i = 1 to N/2+1
        for j = 1 to N/2+1
            if ( sqrt ((i-1) 2 + (j-1) 2) * Δu > w_H)
                A [i [j] = 0.0
            end
        end
    end
```

High pass filtering is now performed to remove all frequencies less than $\omega_L$. Using the same rectangular filtering, all terms with frequency content less than $\omega_L$ and their respective complex conjugates are set to 0. Letting $\omega_L=3.9\Delta u$, FIG. 6 illustrates the spectral surface array after both the low- and high-pass filtering have been performed.

The following pseudocode will perform high-pass filtering:

```
// Perform high-pass filtering
    for i = 1 to N/2+1
        for j = 1 to N/2+1
            if ( sqrt ((i-1)^2 + (j-1)^2) * Δu > w_H)
                A[i] [j] = 0.0
            end
        end
    end
```

It tends to be easier to filter the real frequencies, then copy the complex conjugates to where the imaginary frequencies are stored in the spectral array instead of performing the filtering on both the real and imaginary frequencies.

Now, using any acceptable Fast Fourier Transform routine, the representation of spatial surface f(xy), can now be created. It will be an array of points M×N in size (where preferably M=N) with spatial step sizes of Δx and Δy. The spatial surface will be comprised of a sum of sine waves between the frequencies $\omega_L$ and $\omega_H$. The next step is to calculate the magnitude of the spatial surface in terms of root-mean-square, or rms, of a discrete 2-D surface represented by the array. I use the formula:

$$rms = \sqrt{\frac{1}{mn}\sum_{i=1}^{m}\sum_{j=1}^{n} x^2(i, j)} \quad (8)$$

where m is the number of columns in the array and n is the number of rows in the array. The resulting rms value for the array is compared to a rms value pre-selected by the user in accordance with the magnitude the user desires the generated terrain surface to have. Each of the points in the array is multiplied by a/b, where a is the desired rms value and b is the rms value of the array. The resulting array will have the desired rms value.

Figure 1:
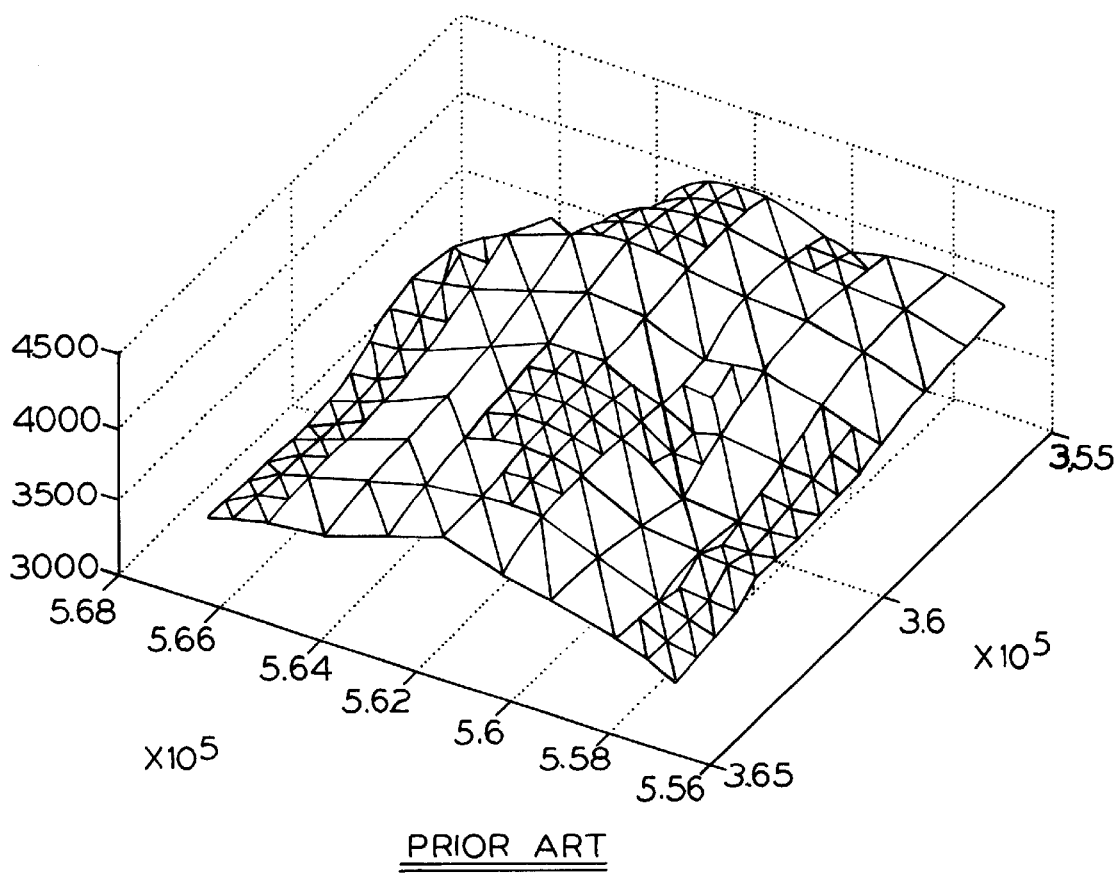
FIG. 1 is a polygonal grid used by a visual database generator such as the Evans and Sutherland ESIG® HD/3000 generator.
Figure 2:
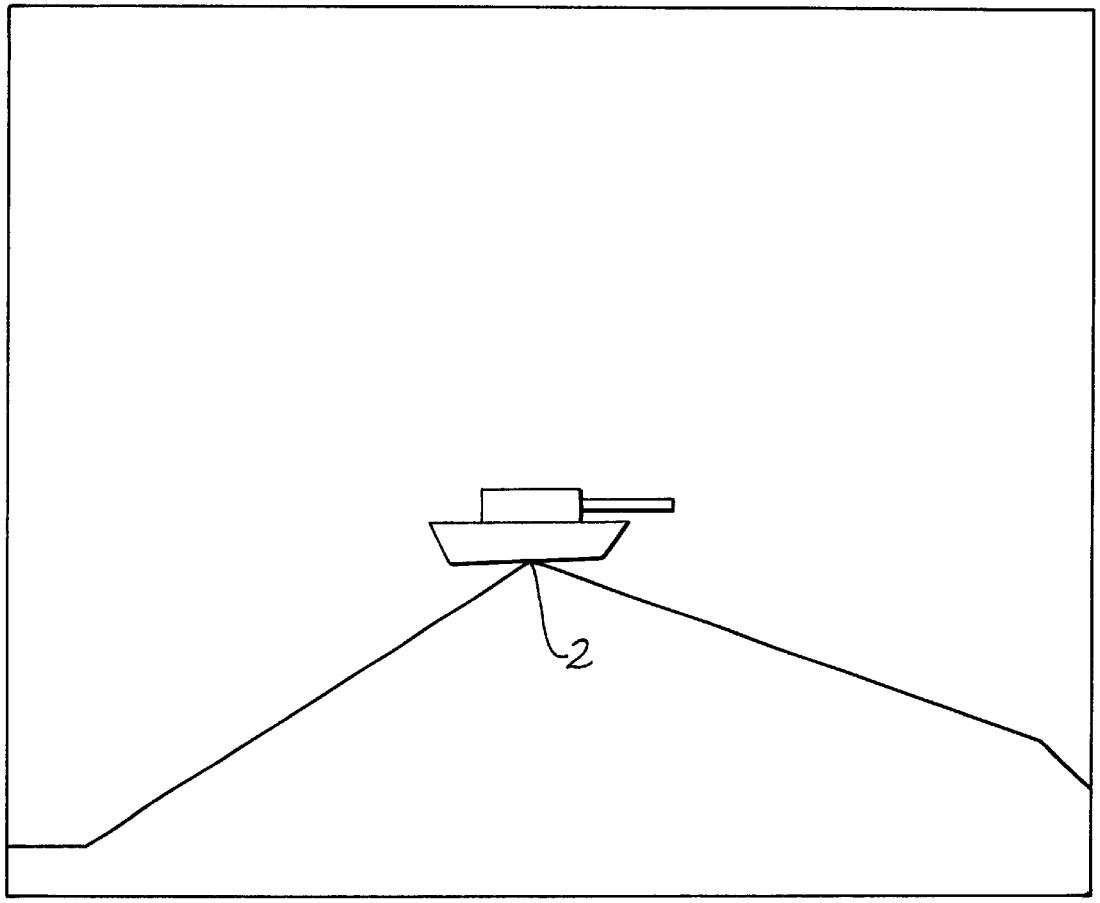
FIG. 2 shows geometric discontinuity at a polygonal boundary within a simulated terrain.

The resulting array can be regarded as representing a high-resolution square surface patch of terrain where the sides of the square patch have a length l. The patch will be superimposed onto a lower resolution surface generated by a computer image generator. As exemplified in FIG. 1, the computer-generated lower resolution surfaces are typically comprised of pairs of isosceles right triangles having a common hypotenuse, the pairs of triangles forming squares having diagonals running between opposed corners. It is contemplated that the side length, l, of the square patch is chosen to be equal to the side length of the square formed in the lower resolution surface. In the case where the triangles in the computer generated surface form non-square rectangles, the sides of the patches are chosen to equal the lengths of the sides of the non-square rectangles.

Figure 7:
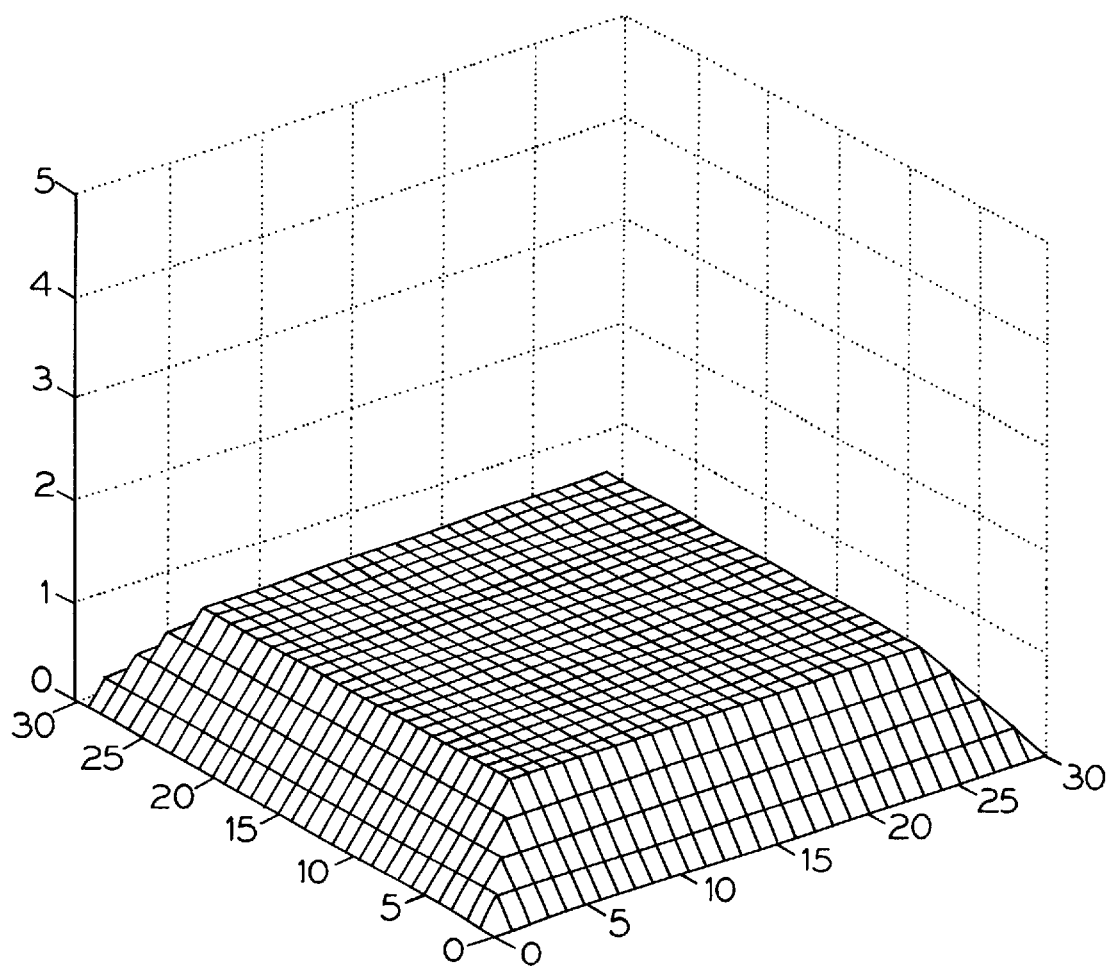
FIG. 7 is an example of a truncated pyramid used in filtering a spatial representation of a surface patch generated in my method.
Figure 8:
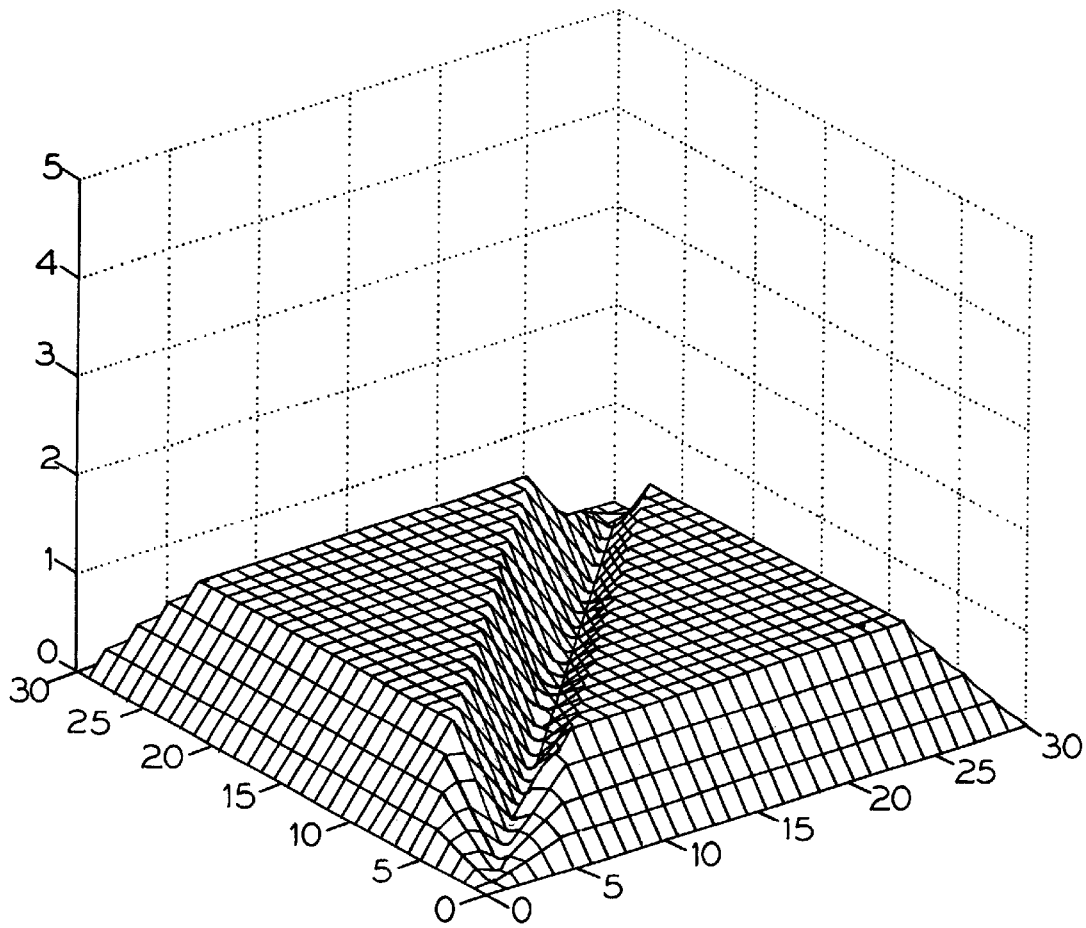
FIG. 8 is a truncated pyramid whose diagonal ditch corresponds to adjoining hypotenuses of triangles of a lower resolution surface.
Figure 9A:
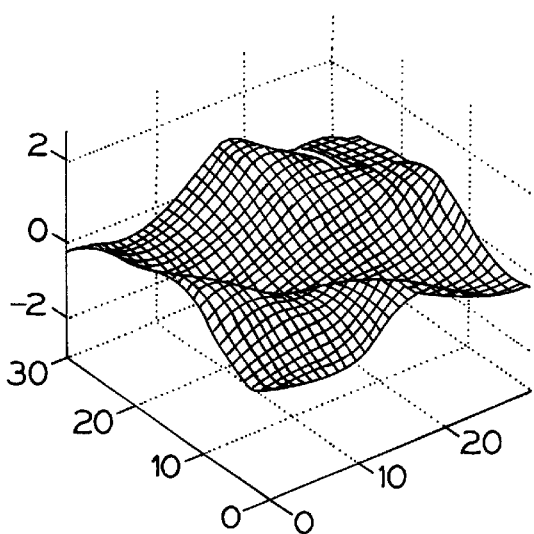
FIG. 9(a) shows a simulated terrain surface before filtering according to my method.
Figure 9B:
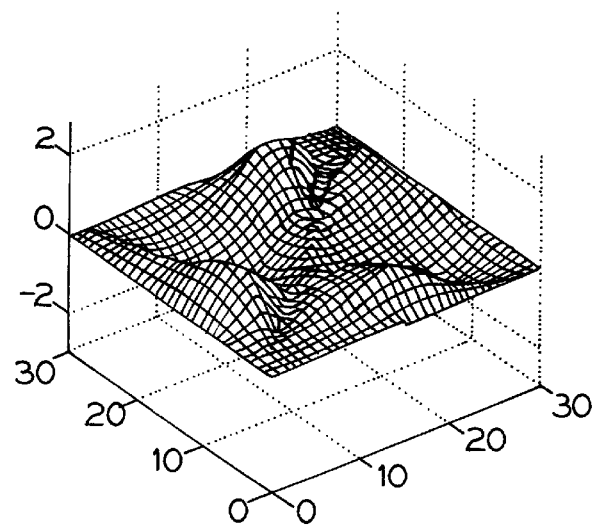
FIG. 9(b) shows that surface after low pass filtering.

Before superimposing the patch onto the square or rectangle of the lower resolution surface, the surface boundaries, or edges of the patch are forced to zero. This forcing is done by filtering the spatial surface of the patch. One method of filtering is to multiply the spatial surface by a truncated pyramid, keeping the boundary points to zero while keeping the interior points at their constructed values with a small ramp between the boundary points and the interior points. FIG. 7 shows an example of a truncated pyramid used in filtering the spatial surface. The user may wish to force the patch not only to be bound to the lower resolution surface at the rectangular boundaries, but may also wish the patch to be close to the aforementioned diagonal (the boundary between the lower resolution surface's triangles). If so, the filtering can be done by using a truncated pyramid with a gain of one and a diagonal trench corresponding to the boundary between the triangles. An example of a truncated pyramid featuring a diagonal trench is shown in FIG. 8. Examples of the results of different filtering techniques are illustrated by use of FIGS. 9(a), 9(b) and 9(c). An unfiltered surface is shown in FIG. 9(a), a surface filtered by a truncated pyramid is shown in FIG. 9(b) and a surface filtered by a truncated pyramid having a diagonal trench is shown in FIG. 9(c).

Figure 9C:
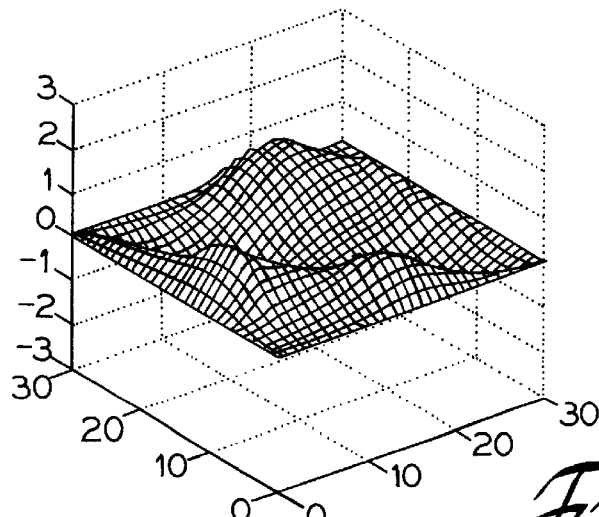
FIG. 9(c) shows the same surface after both low-pass and high-pass filtering.

With respect to FIG. 9(c), one notes that the values of the high-resolution surface patch along the diagonal are zero. However, in a NURBS (non uniform rational B-spline) surface corresponding to the patch created later in my technique, the points along the diagonal will not be forced completely to zero, but will merely be pulled toward zero. If the user wishes for the high resolution surface to be pulled closer to zero along the diagonal, the weights of control points on the diagonal can be increased in value relative to control points elsewhere on the NURBS surface.

Extracting NURBS Control Points

Once the filtering of the spatial surface of the patch is complete, one has an acceptable representation of a surface, which can be overlaid upon the corresponding portion of the lower-resolution image generator database to create the representation of a hybrid surface. Once the hybrid surface representation is created, the control points for the corresponding NURBS surface can be extracted from it. If one denotes the hybrid surface as f(x,y), then the sampling increment in the x and y directions, Δx and Δy, are defined as:

$$\Delta x = \frac{l_x}{M} \text{ and } \Delta y = \frac{l_y}{N} \quad (9)$$

where $l_x$ is the length of the side of the surface patch along the x axis and $l_y$ is the length of the side of the surface patch along the y axis, and f(x,y) is represented by an M×N array, which can be called P. Usually, as stated earlier M and N will be equal and f(x,y) will be a square surface patch. M can be unequal to N when, for example, the surface patch is rectangular, or when the surface patch has different frequency contents along the x and y axes so that Δx ≠Δy. Additionally, M can be unequal to N when special surface features require further manipulation of NURBS control points so as to necessitate a smaller sampling increment along one axis. Most commonly, though, the high-resolution surface patch is designed to introduce random elevation perturbations to a lower-fidelity surface patch. In this situation M=N, $l_x=l_y$, and Δx=Δy.

The surface that has been created, f(x,y), contains, as a minimum, all the necessary frequency content which has been specified by the user. To extract the NURBS control points from the surface, extraction steps along the x and y axes must respectively be less than $$\frac{\lambda_{x\min}}{2} \text{ and } \frac{\lambda_{y\min}}{2}$$

to satisfy the Nyquist sampling criteria. It will be recalled that the satisfaction of the Nyquist criteria was accomplished at an earlier stage of my method, when points were selected to represent a spectral fractal Brownian surface in the spatial domain. The number of sample points has remained constant up to this point in the method, whereby an appropriate number of sample points still exist to satisfy the Nyquist criteria in nearly all cases. Exceptions may occur, for example, if the user at this stage determines that the maximum frequency content of the surface can be lowered, so that the number of samples required by the Nyquist criteria becomes lower. In these exceptional cases, the extraction step size should be used which is the largest integer multiple of $\Delta x$ and $\Delta y$ that still satisfies the Nyquist criteria. To do this, find the largest value of $k_x$ where $$k_x \Delta x \leq \frac{\lambda_{x\,min}}{2}$$

and the largest value of $k_y$ where $$k_y \Delta y \leq \frac{\lambda_{y\,min}}{2}.$$

Since one needs to extract the first and last points, along each axis, adjust the foregoing values of $k_x$ and $k_y$ so that $(M-1)/k_x$ and $(N-1)/k_y$ are integers that will satisfy the extraction step criteria. Then select the first point along each axis and continue e at an increment of $k_x \Delta x$ in the x direction and $k_y \Delta y$ in the y direction. The control points now form a new 2-D array $P_{new}$ of new size $M_p \times N_p$ in contrast to the previous array P, whose size is M×N.

Characteristics of the NURBS Control Points and Surface

The aforementioned control points of P (or $P_{new}$) for the NURBS surface are homogeneous points represented as the quadruplet ($w_{i,j}x_{i,j}$, $w_{i,j}y_{i,j}$, $w_{i,j}z_{i,j}$, $w_{i,j}$) where $w_{i,j}$ is the weight assigned to the control point $P_{i,j}$. The weights are user selectable and have the effect of pulling the NURBS surface closer to the control point as $w_{i,j}$ increases. Setting $w_{i,j}$ to zero has the effect of removing the control point from the surface. Setting all the weights to the same value reduces the NURBS surface to a B-spline surface. A more general discussion of NURBS surfaces, including control points, weights and other subjects has been published by L. Piegl and W. Tiller in *The NURBS Book, 2nd Edition*, Springer-Velag, Berlin, 1997.

NURBS were chosen for the final representation form of the high-resolution terrain because they exhibit the following important properties: the surface follows the shape of the control point polygon and is constrained to lie in the convex hull of the control points; an affine transformation can be applied to the surface by applying the affine transformation to its control point representation; the curve or surface exhibits local control (a control point is connected to a limited number of nearby curve segments or surface sections, and moving a control point can influence only these segments or sections); since NURBS are rational, higher weights at certain knot values will draw the surface closer to the control points; and the curve or surface, while defined by a finite set of control points and knots, has continuous resolution.

Once the control point array P has been created, two knot vectors need to be created. The knot vectors U and V correspond to the x and y directions, respectively. Let the degree (the highest exponent for a variable in an equation representing the surface) of the surface in the x direction be denoted as p and the degree of the surface in the y direction be denoted as q. If the number of control points in the x direction is m and the number of control points in the y direction is n, then the number of knots in U will be r+1 and the number of knots in V will be s+1 where $$r = m+p \text{ and } s = n+q \tag{10}$$

The knot vectors are defined as $$V = \left\{ \underbrace{0, \ldots, 0}_{q+1}, v_{q+1}, \ldots, v_{s-q-1}, \underbrace{1, \ldots, 1}_{q+1} \right\} \tag{11}$$

where the horizontal brackets indicate that U has p+1 knots whose value is 0 and has p+1 knots whose value is 1, and $$U = \left\{ \underbrace{0, \ldots, 0}_{p+1}, u_{p+1}, \ldots, u_{r-p-1}, \underbrace{1, \ldots, 1}_{p+1} \right\} \tag{12}$$

where the horizontal brackets indicate that U has q+1 knots whose value is 0 and has q+1 knots whose value is 1. For a cubic NURBS surface, p=q=3 and U has m+4 knots in the vector and V has n+4 knots in the vector. The knot vectors will look like:

$$U = \{0,0,0,0,u_5 \ldots u_m,1,1,1,1\} \tag{13}$$

$$V = \{0,0,0,0,v_5 \ldots v_m,1,1,1,1\} \tag{14}$$

Typically the knot values are spaced equidistantly between 0 and 1.

Continuity among Surface Patches

The final step in the creation of a high-resolution surface overlay is to create $G^1$ continuity between surface patches. The definition of geometric continuity between two adjacent surfaces P and Q is: $G^0$ continuity exists if P and Q share a common boundary; and $G^1$ continuity exists if P and Q share a common normal vector at each point along the common boundary. The first step in achieving $G^1$ continuity is to ensure that the number of control points for surface patches P and Q along the common boundary are equal. If they are not, apply the technique of knot insertion described in the section described below. If they are equal, one can proceed directly the surface smoothing described in the subsequent section.

Knot Insertion

As stated by Piegl and Tiller, supra, knot insertion can be used to: evaluate points and derivatives on curves and surfaces, subdivide curves and surfaces, and add control points in order to increase flexibility in shape control (for interactive design). To begin the knot insertion process, let $$C^w(u) = \sum_{i=0}^{n} B_{i,p}(u) P_i^w \tag{15}$$

be a NURBS curve defined on $U = \{u_0, \ldots, u_m\}$ where $B_{i,p}(u)$ are the $p^{th}$ degree basis functions and $P_i^w$ are the control points. While this method is detailed here using curves, it is easily expanded for use on NURBS surfaces. If one wishes to insert a knot $\bar{u}$ into U to form the new knot vector $\bar{U} = \{\bar{u}_0 = u_0, \ldots, \bar{u}_k = u_k, \bar{u}_{k+1} = \bar{u}, \bar{u}_{k+2} = u_{k+1}, \ldots, \bar{u}_{m+1} = u_m\}$, the new curve $$C^w(u) = \sum_{i=0}^{n+1} \bar{B}_{i,p}(u) Q_i^w \tag{16}$$

is created using the modified basis functions $\bar{B}_{i,p}(u)$ and the new set of control points $Q_i^w$. From Piegl and Tiller, supra, we are given the relationship between the original control points $P_i^w$ and the new control posts $Q_i^w$ resulting from inserting a knot as $$P_i^w = Q_i^w \quad i=0, \ldots, k-p-1$$
$$P_i^w = Q_{i+1}^w \quad i=k=1, \ldots, n \quad (17)$$

We seek control points $Q_i^w$ for $i=k-p, \ldots, k$. Piegl and Tiller, supra, provide a complete theoretical description of inserting knots and creating a new set of control points. The equations below present the final solution for doing so. Let $$\alpha = \begin{cases} 1 & i \leq k-p \\ \dfrac{\bar{u} - u_i}{u_{i+p} - u_i} & k-p+1 \leq k \\ 0 & i \geq k+1 \end{cases} \quad (18)$$

and $$Q_i^w = a_i P_i^w + (1-a_i) P_{i-1}^w \quad (19)$$

For a surface, this method would be applied in both the u and v axis as needed to make the number of control points in each surface patch equal. Note that if knot insertion is used and control points are added along the surface edges, spatial surface filtering will have to be performed again to bring the edge control points to zero, giving us $G^0$ continuity between patches.

Surface Smoothing

Now that the adjacent surface patches P and Q have the same number of control points along the common boundary, an algorithm to achieve $G^1$ continuity can be applied to them. Various studies have been performed on geometric continuity between adjacent NURBS surface patches. (Oppenheim A. V., Schafer R. W., *Discrete-Time Signal Processing*, Prentice Hall, Englewood Cliffs, N.J. 07632; Zhou, S., Yang H., *Tangent Plane Continuity Condition Between Adjacent NURBS Surface Patches*, Proceeding from the Fourth International Conference on Computer-Aided Design and Computer Graphics, Oct. 23–25, 1995; Lizhaung Ma and Zhijun He, *Methods and Techniques for Advanced Curve and Surface Modeling*, Proceeding from the Fourth International Conference on Computer-Aided Design and Computer (Graphics, Oct. 23–25, 1995; Barsky B. A. and DeRose T. D., *Geometric Continuity of Parametric Curves: Three Equivalent Characterizations*, IEEE Computer Graphics and Applications, Vol. 9, No. 6, 1989; and Barsky B. A. and DeRose T. D., *Geometric Continuity of Parameteric Curves: Construction of Geometrically Continuous Splines*, IEEE Computer Graphics and Applications, Vol. 10, No. 1, 1990.) Fortunately, since one is creating a random surface in my method, one is not bound by the tight restraints that normally otherwise govern the manipulation of NURBS surfaces when achieving G1 continuity.

By performing the filtering described earlier, all surface patches were manipulated so that the z values of the edges of the patches were set to zero before they were overlaid upon the lower-resolution terrain. This produces $G^0$ continuity between surface patches. Put simply, all the surface patch edges meet (there are no gaps between surface patches), but they have different surface normals at the points where they meet. If a row or column of control points along the surface are manipulated, we are still left with a random surface, which meets the initial goal of a cross-country terrain representation to provide high-fidelity perturbations to a vehicle dynamic model.

Figure 10:
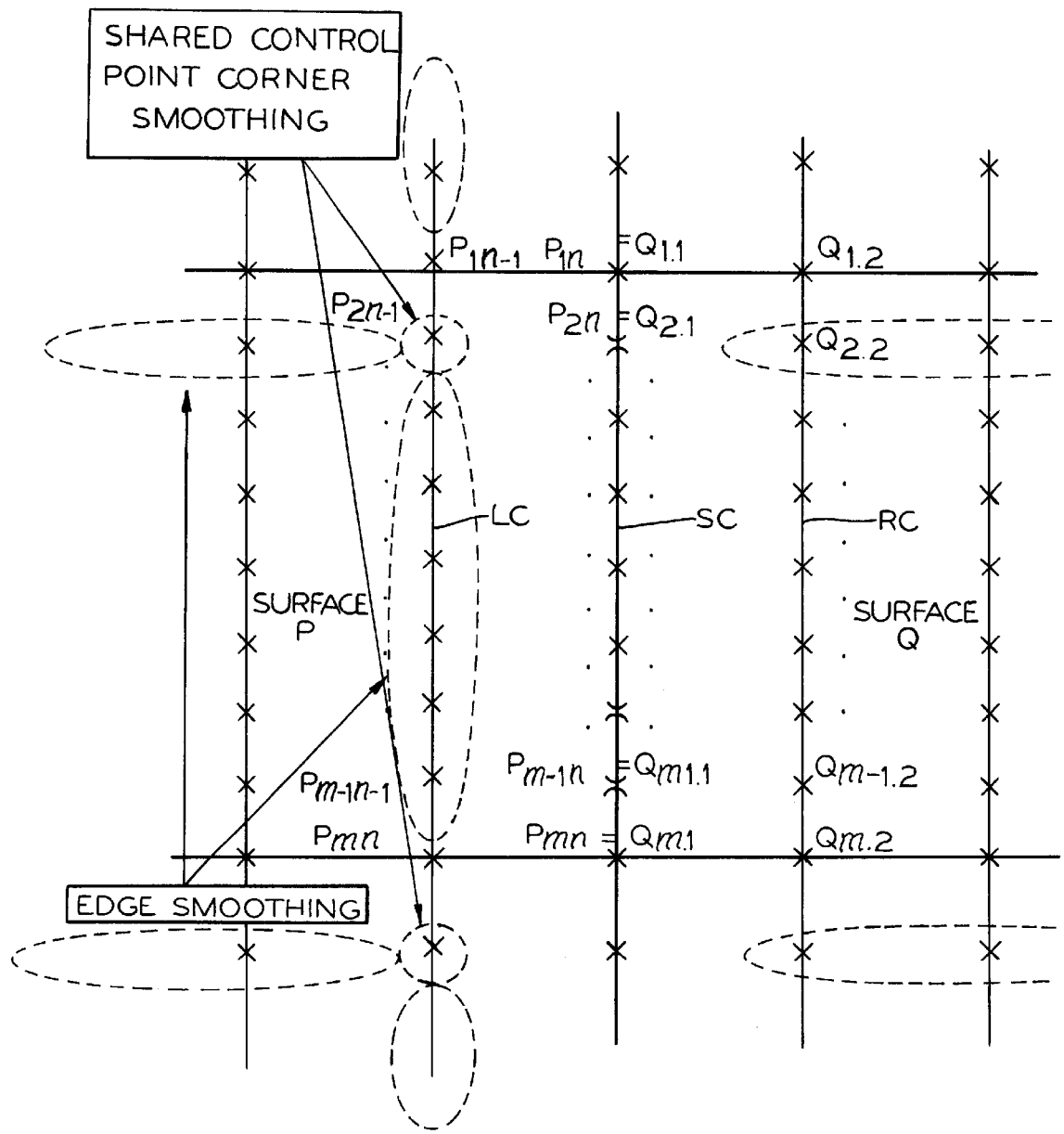
FIG. 10 is an example of control point grids for adjoining arrays representing two surface patches.

FIG. 10 shows a sample control point grid for adjacent surface patches P and Q. The number of the control points along the common boundary between patches P and Q are equal, thus making it simpler to guarantee $G^1$ continuity between the surface patches. One now need only adjust the vectors that connect points in the shared column or boundary ("SC" in FIG. 10) with control points in the columns to either side ("LC" and "RC"). These vectors are adjusted to have the same direction and have a constant factor for magnitude along the boundary. Due to the filtering performed previously, the boundary control points of array P are equal to the boundary control points of array Q along the edge between P and Q. That is, in FIG. 10, $P_{i,n} = Q_{i,1}$ for $1 \leq i \leq m$. Now we make an adjustment to the column of control points $P_{i,n}$ so that the three columns of control points $P_{i,n-1}$, $P_{i,n}$ (which is also $Q_{i,1}$) and $Q_{i,2}$ are linear (on the same straight line) for all i, where $1 \leq i \leq m$. This adjustment also causes the set of vector lengths between $P_{i,n-1}$ and $P_{i,n}$ (or $Q_{i,1}$) to have a constant ratio with corresponding vector lengths between $P_{i,n}$ (or $Q_{i,1}$) and $Q_i$, for all i, where $1 \leq i \leq m$. That is $$\overrightarrow{P_{i,n-1} P_{i,n}} = k \overrightarrow{Q_{i,1} Q_{i,2}} \quad \text{for } 1 \leq i \leq m \quad (20)$$

Although the foregoing aspect of surface smoothing was described in terms of adjusting columns of points in spectral arrays, the aspect of surface smoothing is also useful for adjusting rows of points in adjoining arrays.

Figure 11:
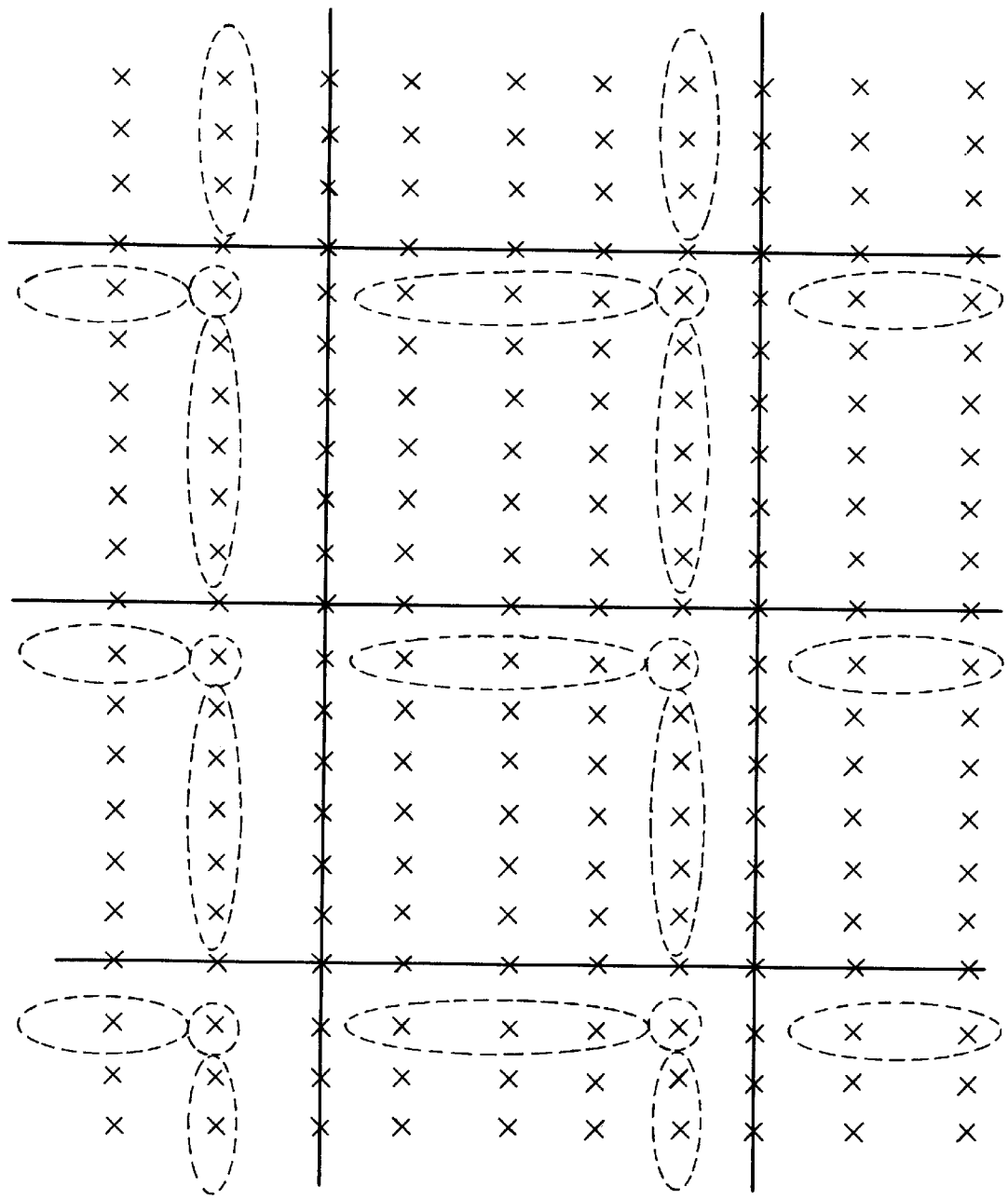
FIG. 11 shows a multiplicity of adjoining arrays where ellipses enclose rows or columns of control points to be adjusted to achieve $G^1$ geometric continuity over the entire surface represented by the arrays. Points common to a row and column to be adjusted are enclosed by circles.

The final step in surface smoothing is to take note of the interior corner control points, which are circled in FIGS. 10 and 11. These control points are shared by the row and column of control points that need to be manipulated to achieve $G^1$ continuity. A solution exists in which this control point will satisfy the conditions for $G^1$ continuity simultaneously for both the border and row column of control points. See Nachman, L. J., *Matching NURBS Surfaces $G^1$ and $G^2$*, Presented to Mathematics of Curves and Surfaces VI, Brunel University, 1994. Although the Nachman paper has been published for several years, a copy of the Nachman paper is attached as an Appending at the end of this application for convenient reference.

$G^1$ Continuity Example

Figure 12:
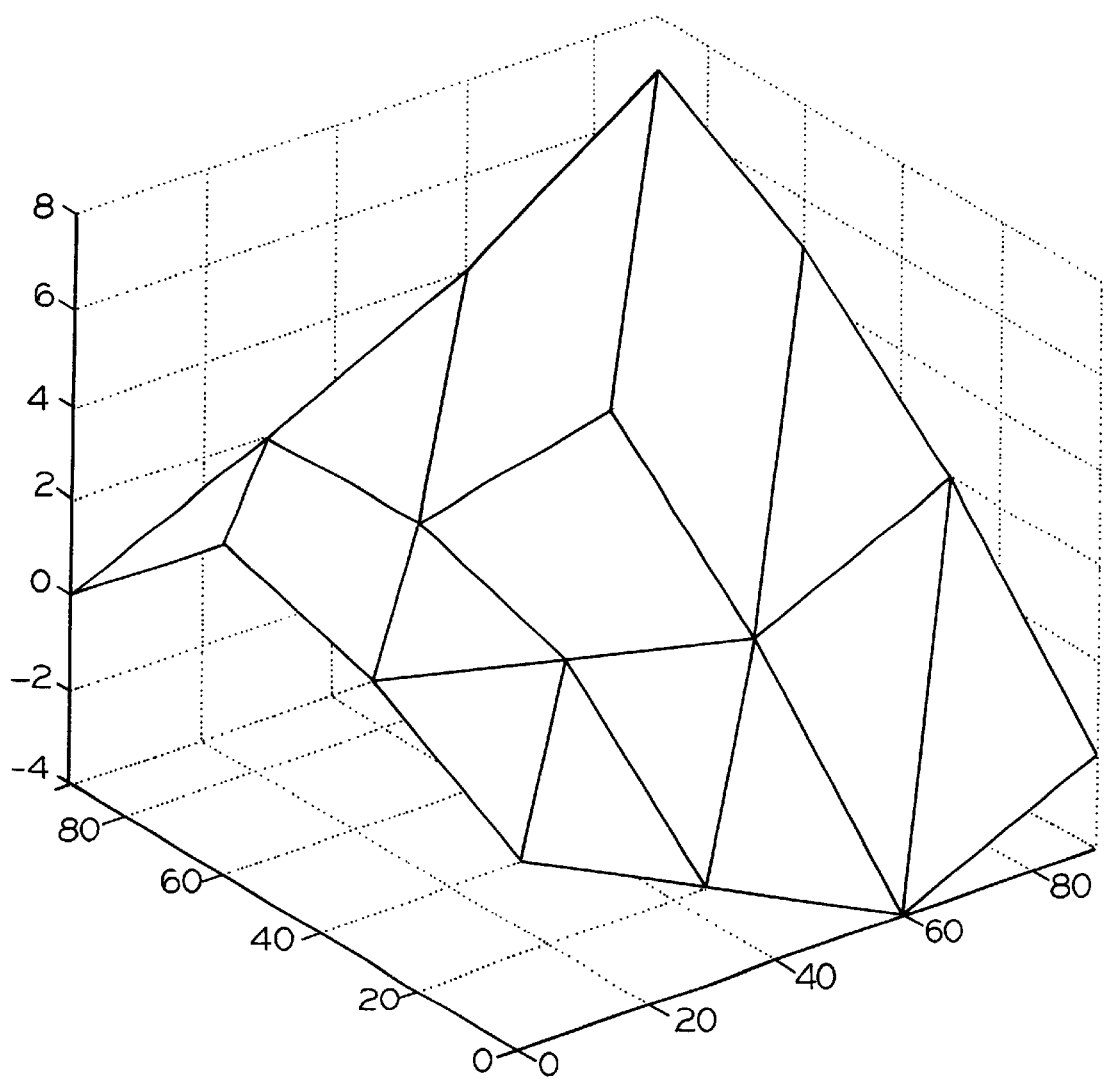
FIG. 12 is an example of a surface terrain extracted from an image generator.

As an example of my method of generating a terrain surface, FIG. 12 shows a surface terrain extracted from an image generator. The terrain surface consists of 18 triangular polygons grouped into 9 square polygons. Each side of the square polygons is 30 m in length. The high-resolution overlay was created using the following parameters:

Maximum Wavelength=15 m
Minimum Wavelength=30 m
rms value=0.5 m
Fractal Dimension=1.0

Figure 13:
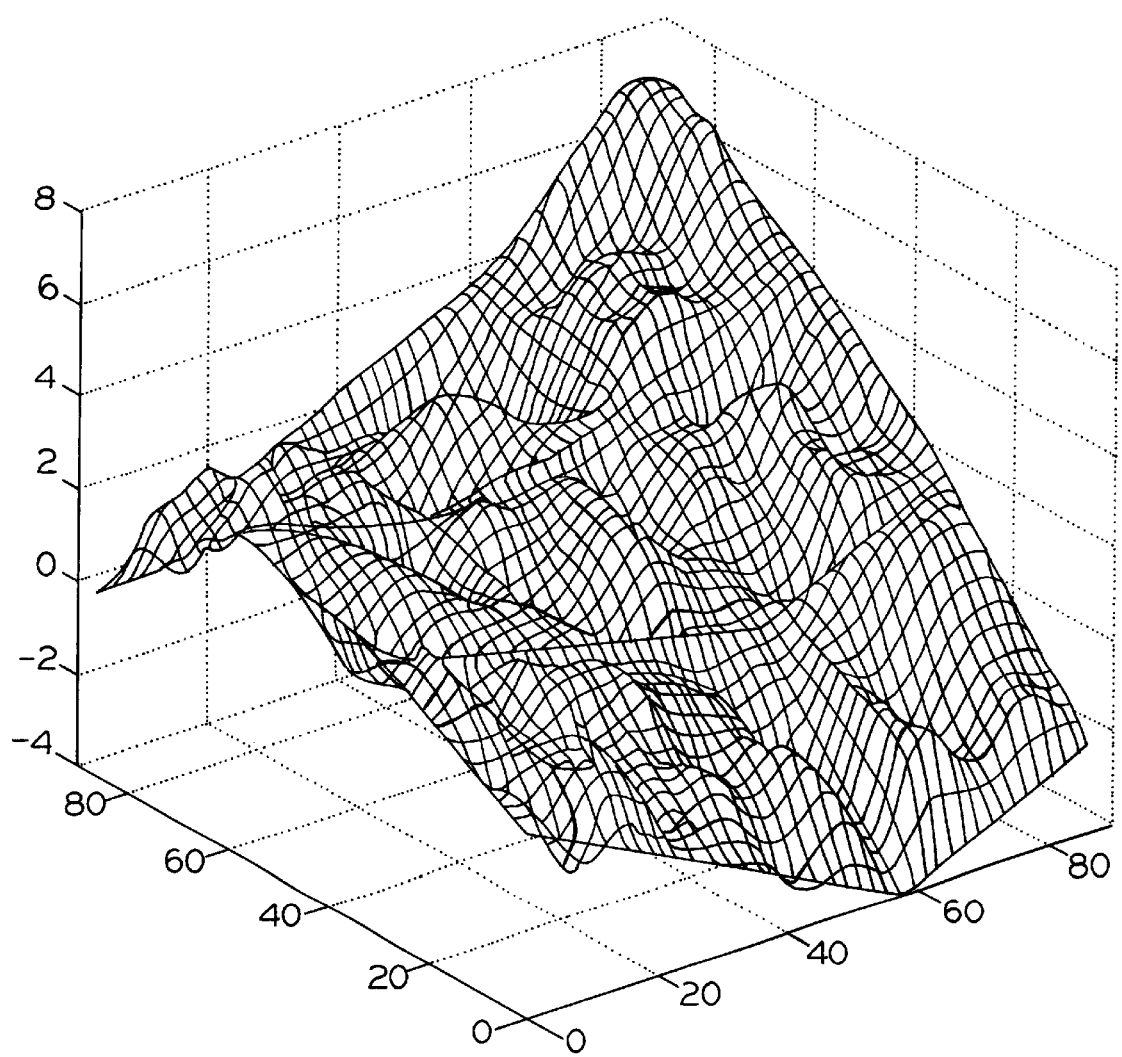
FIG. 13 is a plot of NURBS control points derived by my method and overlaid on the terrain Of FIG. 12 to create a hybrid terrain database.
Figure 14:
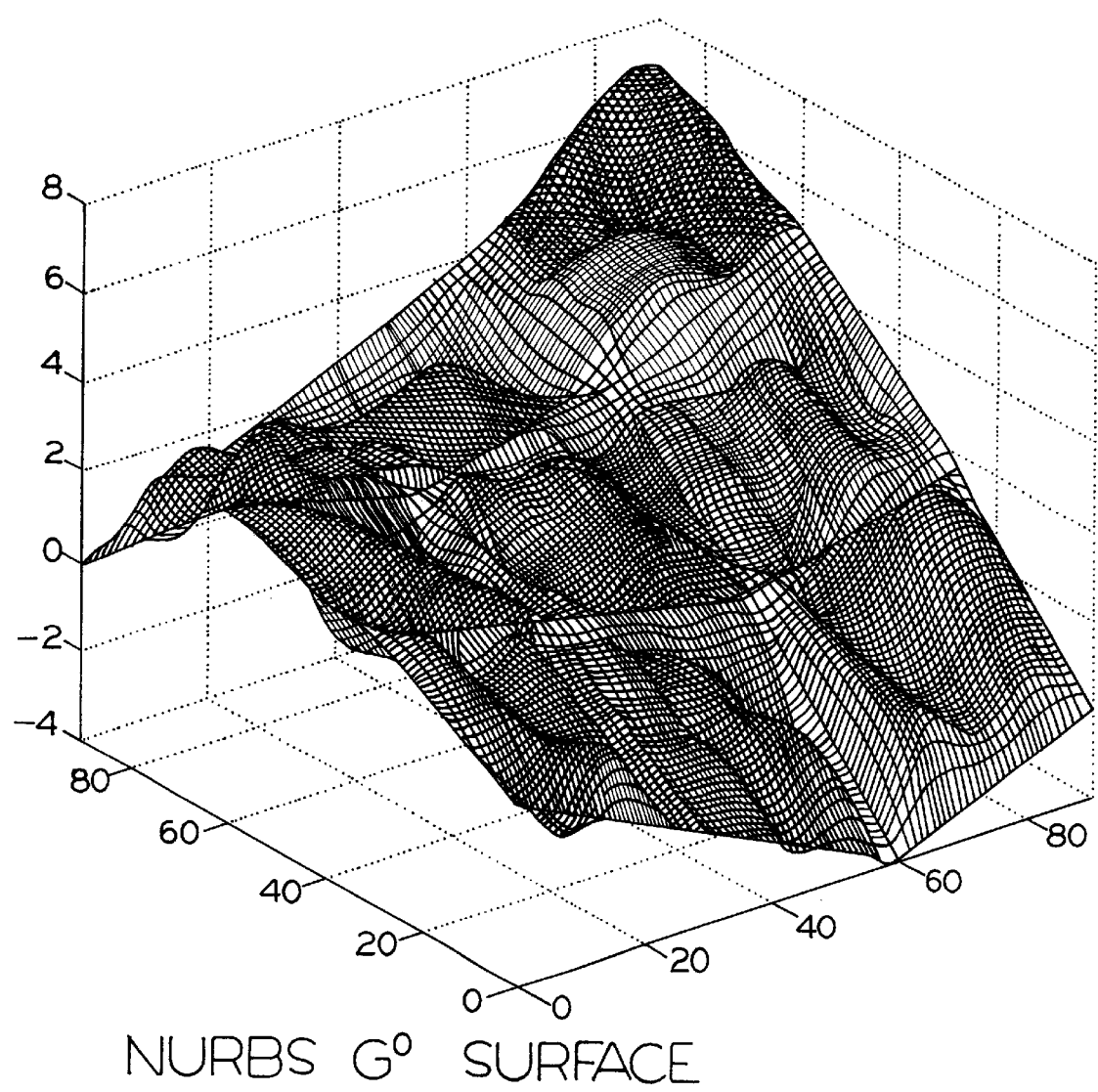
FIG. 14 is a rendering of the surface represented by the arrays in FIG. 13.

The following steps were then performed: creating a high-resolution surface using spectral fractal geometry, performing the low- and high-pass filtering in the frequency domain, converting it to the spatial domain, performing magnitude scaling, edge-filtering and then overlaying the surface upon the low-resolution image generator's surface. As a result of these steps, one obtains a set of control points, which comprise the high resolution surface. FIG. 13 is a plot of these control points and FIG. 14 is the actual rendering of the surface. Notice the circled areas in FIG. 14 which represent the areas where $G^0$ continuity exists at the surface patch edges where the edges are obvious to the naked eye.

Figure 15:
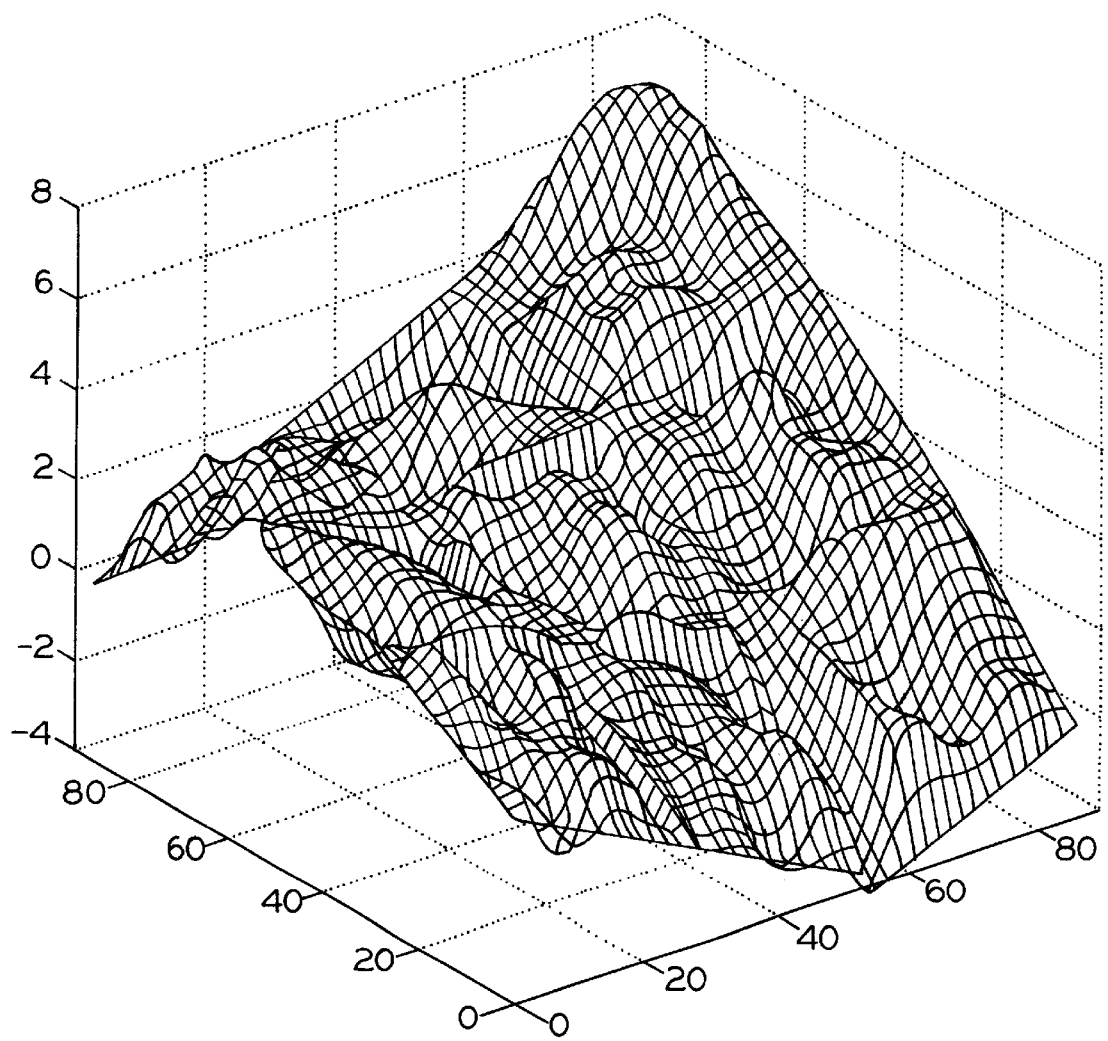
FIG. 15 is a plot of the NURBS control points of FIG. 13 after smoothing is done to enhance geometric continuity.
Figure 16:
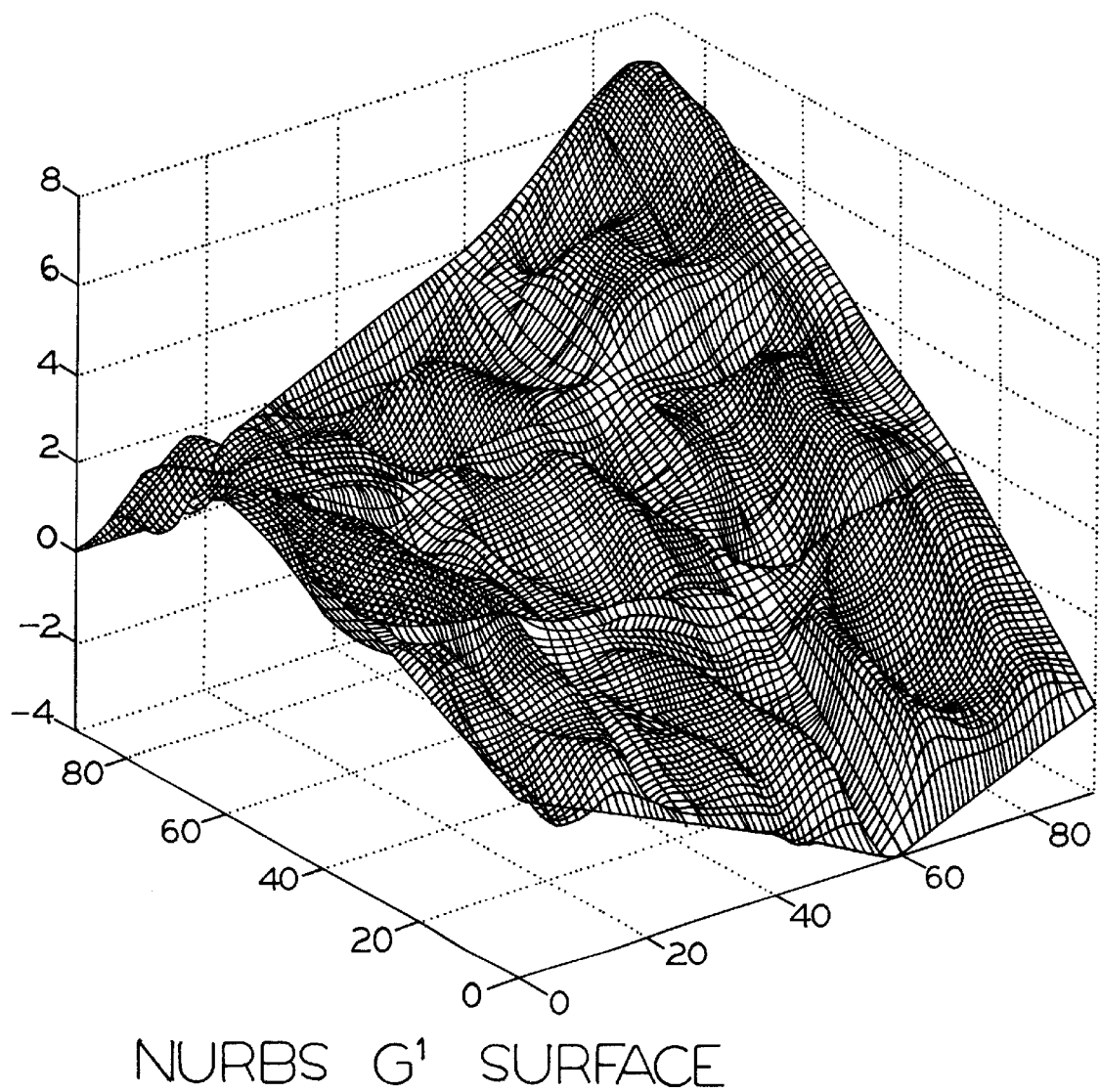
FIG. 16 is a rendering of the surface represented by the points of FIG. 15.

The smoothing methods described previously are then applied to the control point array from FIG. 13, which generated the $G^0$ surface. Starting from the point (0,0) and moving out, the next to right column and next to top row in each surface patch were manipulated to provide $G^1$ continuity. The resultant control point plot is given in FIG. 15 and the corresponding surface is shown in FIG. 16. Note the area circled in FIG. 16 and compare them to the circled areas in FIG. 14. One can notice the smoothing where the surfaces come together. Each surface is a 20 m×30 m patch, so looking at the boundaries (along the 0 m, 30 m, and 60 m grid lines) will point out the benefits of $G^1$ smoothing.

Computer Code for NURBS Surface Creation

Code has been developed in MATLAB™ which perform the following functions:
1 Provide a GUI to enable user input of the surface parameters.
2 Create the spectral surface using spectral fractal geometry (the Fourier filtering method of fractional Browning motion).
3 Perform spectral filtering to create a surface in the specified frequency range.
4 Perform a 2-D inverse FFT to create a spatial surface.
5 Perform magnitude scaling to achieve the desired rms value.
6 Filter the spatial surface to provide $G^0$ continuity.
7 Manipulate the control points to achieve $G^1$ continuity
8 Pass the control points and knot vectors to a Visual C++™ program for surface analysis.
9 Provide a suite of plotting tools.

The code used to perform the NURBS surface analysis was based upon pseudo code provided by Piegl and Tiller, supra, and is written in Visual C++™ on a Windows NT™ platform. This code is presented below as Table A and reads in data files created by the MATLAB™ program (produced by the Math Works, Inc., 24 Prime Park Way, Natick, Mass.) and writes the surface to a data file which the MATLAB™ program will read in. It was decided to write the NURBS surface evaluation code in Visual C++™ for the sake of portability.

TABLE A

NURBS Evaluation Code in Visual C++ ™

Following is code developed in Visual C++ ™ which was used to analyze curves and surfaces. Both the header and the source files are included.

```
// spline.hpp
//
// b-spline class
//
// Written by Alexander A. Reid
// Ph.D. dissertation work
//
// Based upon code found in:
//     "The NURBS Book, 2nd edition"
//     Les Piegel and Wayne Tiller
//     Springer-Verlag
//     Berlin, Germany
//     1997
#ifndef SPLINE_HPP_
#define SPLINE_HPP_
typedef struct
{
    float x, y, z;
}vec3;
typedef struct
{
    float w, x, y, z;
}vec4;
class spline       // b-spline class
{
    private
    // U information
```

TABLE A-continued

NURBS Evaluation Code in Visual C++ ™

Following is code developed in Visual C++ ™ which was used to analyze curves and surfaces. Both the header and the source files are included.

```
    int     p;       // degree of basis functions (order = p+1)
    int     n;       // U has (n + 1) control points
    int     r;       // r = n + p + 1 (# knots = r + 1)
    float   *U;      // u knot vector of length r+1
    int     uSpan;   // knot span of u knot vector
                     //   (ith knot span is on the interval
                     //   from (knot_vector[i],knot_vector[i+1])
    float   *uB;     // Array to hold calculated u basis
                     // function values of degree p
    // V information
    int     q;       // degree of basis functions (order = q+1)
    int     m;       // V has (m + 1) control points
    int     s;       // s = m + q + 1 (# knots = s + 1)
    float   *V;      // v knot vector of length m+1
    int     vSpan;   // knot span of v knot vector (ith knot
                     //   span is on the interval
                     //   from (knot_vector[i],knot_vector[i+1])
    float   *vB;     // Array to hold calculated v basis
                     // function values of degree p
    // Curve information
    vec4    *uP;     // curve control point vector
    // Surface informnation
    vec4    **P;     // 2-D control point array
    // Decision information
    bool    curve;   // True if curve, false if surface
public:
    spline();        // constructor
    ~spline();       // destructor
///////////////////////////////////////////////
// U functions
// determine the knot span index for the u knot vector
    int          uFindSpan(float u);
// input the u knot vector, default order = 3
    void         uSetKnotVector(int, float*);
// input the u knot vector, specify order
    void         uSetKnotVector(int, float*, int);
// return basis function value at point u
    float*       UBasisFunction (float)
// print non-vanishing basis function values
    void         uPrintBasisFunction(void)
///////////////////////////////////////////////
// V functions
// determine the knot span index for the v knot vector
    int          vFindSpan(float v);
// input the v knot vector, default order = 3
    void         vSetKnotVector(int, float*);
// input the v knot vector, specify order
    void         vSetKnotVector(int, float*, int);
// return basis functon value at point v
    float*       vBasisFunction(float);
// print non-vanishing basis function values
    void         vPrintBasisFunction(void)
///////////////////////////////////////////////
// Curve functions
// input the curve control points for u axis (weight = 1)
    void    SetControlpoints(vec3*);
// input the curve control points along the u axis
    void    SetControlPoints (vec4*);
// Calculate the curve point given the value u
    vec4    CurvePoint(float);
// evaluate the bspline curve and write to a file
    void    FileWrite(FILE*; FILE*, FILE*, float, float, float);
///////////////////////////////////////////////
// Surface functions
// evaluate the bspline surface and write to a file
    void    FileWrite(FILE*, FILE*, FILE*, float, float, float,
                      float, float, float);
// input the surface control points (weight = 1)
    void    SetControlPoints(vec3**);
// input the surface control points
    void    SetControlPoints(vec4**);
// Calculate the surface point given u and v
    vec4    SurfacePoint(float, float);
```

TABLE A-continued

NURBS Evaluation Code in Visual C++ ™

Following is code developed in Visual C++ ™ which was used to analyze curves and surfaces. Both the header and the source files are included.

```
//////////////////////////////////////////////////////////
// Decision functions
// Decide if a curve or surface
    bool    type (void);
// Return the minimum of two integers
    intmin(int, int);
};
#endif   // SPLINE_HPP_
// spline.cpp
// member functions for the b-spline class
//
// Written by Alexander A. Reid - December 1997
//    for doctoral dissertation research
// Based upon code found in:
//   "The NURBS Book, 2nd edition"
//   Les Piegel and Wayne Tiller
//   Springer-Verlag
//   Berlin, Germany
//   1997
#include <iostrearn.h>
#include <stdlib.h>
#include <stdio.h>
#include <process.h>
#include "spline.hpp"
// Constructor
spline::spline()
{
    p = 3;      // set default degree of u basis functions = 3 (order =4)
    q = 3;      // set default degree of v basis functions = 3 (order =4)
}
// Destructor
spline::~spline ()
{
    delete U;       // free up memory from knot vector
    delete V;       // free up memory from knot vector
    delete uB;      // free up memory from basis function array
    if (!curve)
        delete vB;  // free up memory from basis function array
    if (curve)
        delete uP;
    else
    {
        for (int i=0; i<n+1; i++)
            delete P[i];
        delete []P;
    }
}
// Decide if the user is analyzing a curve or surface
bool spline::type(void)
{
    int     i;
    cout << end1 << "Do you wish to analyze a curve (0) or surface (1)";
    cin << i;
    if (i == 0)
        curve = true;
    else
        curve == false;
    return (curve);
}
// Create a min function
int spline::min(int a, int b)
{
    if (a < b)
        return (a);
    else
        return (b);
}
// Determine the knot span index for the u knot vector
int spline::uFindSpan(float u)
{
    // check to see if we are at the end of the span index
    if (u == U[n+1])
```

```
    {
        uSpan = n;
        return  (uSpan);
    }
    // otherwise perform a binary search
    int     low    = p;
    int     high   = n+1;
    uSpan = (low+high)/2;
    while ( (u < U[uSpan]) || (u >= U[uSpan+1]) )
    {
        if (u < U[uSpan])
            high = uSpan;
        else
            low = uSpan;
        uSpan = (low+high)/2;
    }
    return (uSpan)
}
// Determine the knot span index for the v knot vector
int spline::vFindSpan(float v)
{
    // check to see if we are at the end of the span index
    if (v == V[m+1])
    {
        vSpan = m;
        return (vSpan);
    }
    // otherwise perform a binary search
    int     low    = q;
    int     high = m+1;
    vSpan = (low+high)/2;
    while ( (v < V[vSpan]) || (v >= V[vSpan+1]) )
    {
        if (v < V[vSpan]
            high = vSpan;
        else
            low = vSpan;
        vSpan = (low+high)/2;
    }
    return (vSpan);
}
// Enter the u knot vector, assume cubic B-spline (p = 3)
void spline::uSetKnotVector(int size, float* knots)
{
    int     i;
    p = 3;
    r = size - 1;
    n = r - p - 1;
    // Create the knot vector
    U = new float[size];
    for (i=0; i<size; i++)
        U[i] = knots[i];
    // Create an array to hold the basis function values in
    uB = new float[p+1];
    // check the knot vector for errors:
    //    1. The beginning (p+1) knots = 0
    for (i=0; i<p; i++)
        if (U[i] != U[i+1] || U[i] != 0.0)
            cout << "ERROR: Invalid knot vector: Beginning knots not of proper multiplicity" << end1;
    //   2. The final (p=1) knots = 1
    for (i=r-p; i <r; i++)
        if (U[i] != U[i+1]
            cout << "ERROR: Invalid knot vector: End knots not of proper multiplicity" << end1;
    //   3. The intermediate knots must be non-decreasing
    for (i=p; i<r-p; i++)
        if ([i] > U[i+1])
            cout << "ERROR: Invalid knot vector: Increasing values in knot vector" << end1;
}
// Enter the u knot vector, let the user specify the order of the basis
// functions
```

TABLE A-continued

NURBS Evaluation Code in Visual C++ ™

Following is code developed in Visual C++ ™ which was used to analyze curves and surfaces. Both the header and the source files are included.

```cpp
void spline::uSetKnotVector(int size, float* knot, int order)
{
    int    i;
    p = order - 1;   // p = order of basis functions
    r = size - 1;    // # of knot spans = size of knot vector - 1
    n = r - p - 1;
    // Create the knot vector
    U = new float[size];   // knot vector
    for (i=0; i<size; i++)
        U[i] = knot[i];
    // Create an array to hold the basis function values in
    uB = new float[p+1];
    // check the knot vector for errors:
    //  1. There begining (p+1) knots = 0
    for (i=0; i<p; i++)
        if (U[i] != U[i+1] || U[i] != 0.0)
            cout << "ERROR: invalid knot vector: Beginning knots not of proper multiplicity" << endl;
    //  2. The final (p+1) knots = 1
    for (i=r-p; i<r; i++)
        if (U[i] != U[i+1])
            cout << "ERROR: Invalid knot vector: End knots not of proper mulitiplicity" << endl;
    //  3. The intermediate knots must be non-decreasing
    for (i=p; i<r-p; i++)
        if (U[i[ > U[i+1])
            cout << "ERROR: Invalid knot vector: Increasing values in knot vector" << endl;
}
// Enter the v knot vector, assume 3rd order (q=2)
void spline::vSetKnotVector(int size, float* knots)
{
    int    i:
    q = 3;
    s = size - 1
    m = s - q - 1;
    // Create the knot vector
    V = new float[size];
    for (i=0; i<size; i++)
        V[i] = knots[i];
    // Create an array to hold the basis function values in
    vB = new float[q+i];
    // check the knot vector for errors:
    //  1. The beginning (q+1) knots = 0
    for (i=0; i<q; i++)
        if (V[i] != V[i+1] || V[i] != 0.0)
            cout << "ERROR: Invalid knot vector: Beginning knots not of proper multiplicity" << endl;
    //  2. The final (q+1) knots = 1
    for (i=s-q; i<s; i++)
        if (V[i] != V[i+1])
            cout << "ERROR: Invalid knot vector: End knots not of proper multiplicity" << endl;
    //  3. The intermediate knots must be non-decreasing
    for (i=q; i<s-q; i++)
        if (V[i] > V[i+1])
            cout << "ERROR: Invalid knot vector: Increasing values in knot vector" << endl;
}
// Enter the v knot vector, let the user specify the order of the basis
// functions
void spline::vSetKnotVector(int size, float* knot, int order)
    int    i;
    q = order - 1;   // q = order of basis functions - 1
    s = size - 1;    // # of knot spans = size of knot vector - 1
    n = s - q - 1;
    // Create the knot vector
    V = new float[size];   // knot vector
    for (i=0; i<size; i++)
        V[i] = knot [i];
    // Create an array to hold the basis function values in
    vB = new float[q+1];
    // check the knot vector for errors:
    //  1. There beginning (q+1) knots = 0
    for (i=0; i<q; i++)
        if (V[i] != V[i+1] || V[i] != 0.0)
            cout << "ERROR: Invalid knot vector: Beginning knots not of proper muitiplicity" << endl;
    //  2. The final (q+1) knots = 1
    for (i=s-q; i<s; i++)
        if (V[i] != V[i+1])
            cout << "ERROR: Invalid knot vector: End knots not of proper multiplicity" << endl;
    //  3. The intermediate knots must be non-decreasing
    for (i=q; i<s-q; i++)
        if (V[i] > V[i+1])
            cout << "ERROR: Invalid knot vector: Increasing values in knot vector" << endl;
}
// Enter the curve control point array (weights = 1.0)
void spline::SetControlPoints(vec3* control)
{
    uP = new vec4[n+1];
    for (int i=0; i<=n; i++)
    {
        uP[i].w = 1.0;
        uP[i].x = control[i].x;
        uP[i].y = control[i].y;
        uP[i].z = control[i].z;
    }
}
// Enter the curve control point array (weights = 1.0)
void spline::SetControlPoints(vec4* control)
{
    uP = new vec4[n+1];
    for (int i=0; i<=n; i++)
    {
        uP[i].w = control[i].w;
        uP[i].x = control[i].x * uP[i].w;
        uP[i].y = control[i].y * uP[i].w;
        uP[i].z = control[i].z * uP[i].w;
    }
}
// Enter the surface control point array (weights = 1.0)
void spline::SetControlPoints(vec4 **control)
{
    int    i, j;
    // Create memory for the control point array
    P = new vec4 *[n+1];
    for (i=0; i<n+1; i++)
        P[i] = new vec4[m+1];
    // Fill the control point array
    for (j=0; j<=m; j++)
        for (i=0; i<=n; i++)
        {
            P[i] [j].w = control[i] [j].w;
            P[i] [j].x = control[i] [j].x * P[i] [j].w;
            P[i] [j].y = control[i] [j].y * P[i] [j].w;
            P[i] [j].z = control[i] [j].z * P[i] [j].w;
        }
}
// Print the u basis functions
void spline::uPrintBasisFunction (void)
{
    // Print the non-vanishing basis functions
    for (int j=0; j<=p; j++)
        cout << "B[" << uSpan - p +
j << "," << p << "] = " << uB[j] << endl;
}
// Print the v basis functions
void spline::vPrintBasisFunction(void)
{
    // Print the non-vanishing basis functions
    for (int j=0; j<q; j++)
        cout << "B[" << vSpan - q +
```

TABLE A-continued

NURBS Evaluation Code in Visual C++ ™

Following is code developed in Visual C++ ™ which was used
to analyze curves and surfaces. Both the header and the source files
are included.

```
j << "," << q << "] = " << vB[j] <<
endl;
}
// Enter the control point array
void spline::SetControlPoints(vec3 **control)
    int     i, j;
    // Create memory for the control point array
    P = new vec4 *[n+1];
    for (i=0; i<n+1; i++)
        P[i] = new vec4[m+1];
    // Fill the control point array
    for (j=0; j<=m; j++)
        for (i=0; i<=n; i++)
        {
            P[i] [j].w = 1.0;
            P[i] [j].x = control[i] [j].x;
            P[i] [j].y = control[i] [j].y;
            P[i] [j].z = control[i] [j].z;
        }
}
// Evaluate the basis functions
float* spline::uBasisFunction(float u)
{
    float   *left, *right;
    left    = new float[p+1];    // left[j]    = u – U[Knotspan+1–j]
    right   = new float[p+1];    // right[j]   = U[KnotSpan+j] – u
    float   saved, temp;
    // Compute the non-vanishing basis functions
    for (int i=0; i<=p; i++)
        uB[i] = 0.0;
    uB[0] = 1.0;
    for (int j=1; j<=p; j++)
    {
        left[j]    = u – U[uSpan+1–j];
        right[j]   = U[uSpan+j] – u;
        saved      = 0.0;
        for (int rr=0; rr<j; rr++)
        {
            temp = uB[rr]/(right[rr+1]+left[j-rr]);
            uB[rr] = saved + right[rr+1] * temp;
            saved = left[j-rr] * temp;
        }
        uB[j] = saved;
    }
    // clean house
    delete left;
    delete right;
    return uB;
}
float* spline::vBasisFunction(float v)
{
    float   *left, *right;
    left    = new float[q+1];    // left[j]    = v – V[KnotSpan+1–j]
    right   = new float[q+1];    // right[j]   = V[KnotSpan+j]– v
    float   saved, temp;
    // Compute the non-vanishing basis functions
    for (int i=0; i<=q; i++)
        vB[i] = 0.0;
    vB[0] = 1.0;
    for (int j=1; j<=q; j++)
    {
        left[j]    = v – V[vSpan+L–j];
        right[j]   = V[vSpan+j] – v;
        saved      = 0.0;
        for (int rr=0; rr<j; rr++)
        {
            temp = vB[rr]/(right[rr+1)+left[j-rr]);
            vB[rr] = saved + right[rr+1] * temp;
            saved = left[j-rr] * temp;
        }
        vB[j] = saved;
    }
    // clean house
```

TABLE A-continued

NURBS Evaluation Code in Visual C++ ™

Following is code developed in Visual C++ ™ which was used
to analyze curves and surfaces. Both the header and the source files
are included.

```
    delete left;
    delete right;
    return vB;
}
// Calculate the surface and write it to a file
void spline::FileWrite(FILE *header, FILE *control, FILE *data, float
ustart, float ustop, float uinc, float vstart, float vstop, float vinc)
    int     uIncs, vIncs, i, j;
    vec4    surface;
    float   u, v;
    fprintf(header,"B-spline degree in u = ©n%d", p);
    fprintf(header,"©nB-spline degree in v = ©n%d", q);
    fprintf(header,"©nNo Knots in U =©n%d ©nKnot Vector =", r+1);
    for (i=0; i<=r; i++)
        fprintf(header, "©n%f",U[i]);
    fprintf(header,"©nNo Knots in V =©n%d ©nKnot Vector =", s+1);
    for (i=0; i<=s; i++)
        fprintf(header, "©n%f",V[i]
    fprintf(header,"©nControl Point Array size = ©n%d    %d", n+1,m+
    1);
    for (j=0, j<=n; i++)
        for (i=0, i<=n; i++)
            fprintf(control, "%d %d %f %f %f©n",
                i/j,P[i] [j].x,P[i] [j].y,P[i] [j].z)
    uIncs = (int) ((ustop – ustart) / uinc + 0.5);
    vIncs = (int) ((vstop – vstart) / vinc + 0.5)
    fprintf(header," Number of points on curve = ©n%d    %d",
                uIncs+1, vIncs+1);
    for (i=0; i <32 uIncs; i++)
    {
        for (j=0; j<=vIncs; j++)
        {
            u = uinc * (float)i + ustart;
            v = vinc * (float)j + vstart;
            surface = SurfacePoint(u,v);
            fprintf(data,"%f   %f   %f   %f   %f©n",
                u,v, surface.x, surface.y, surface. z)
        }
    }
}
// Calculate the curve and write it to a file
void spline::FileWrite(FILE *header, FILE *control, FILE *data, float
ustart, float ustop, float uinc)
{
    int     uIncs, i;
    vec4    curve;
    float   u;
    printf(header,"B-spline degree in u = ©n%d", p);
    fprintf(header,"©nNo Knots in U = ©n%d ©nKnot Vector =",
    r+1);
    for (i=0; i<=r; i++)
        fprintf(header, "©n%f",U[i]);
    fprintf(header,"©nControl Point Vector size = ©n%d", n+1);
    for (i=0; i<=n; i++)
        fprintf(control, "%d   %f   %f   %f©n",
                i,uP[h].x,uP[i].y,uP[i].z);
    uIncs = (int) ((ustop – ustart) / uinc 0.5);
    fprintf(header, "© Number of points on curve = ©n%d", uIncs+1);
    for (i=0; i<=uIncs; i++)
    {
        u = uinc * (float)i + ustart;
        curve = CurvePoint (u);
        fprintf(data,"%f   %f   %f   %f©n",
                u, curve.x, curve.y, curve. z);
    }
}
// Calculate the point on a curve. Assume the u axis
vec4 spline::CurvePoint(float u)
{
    int     j;
    vec4    curve;
    uFindSpan(u);
    uBasisFunction(u);
```

TABLE A-continued

NURBS Evaluation Code in Visual C++ ™

Following is code developed in Visual C++ ™ which was used to analyze curves and surfaces. Both the header and the source files are included.

```
    curve.w = curve.x = curve.y = curve.z = 0.0;
    for (j=0; j<=p; j++)
    {
        curve.w += uB[j] * uP[uSpan-p+j].w;
        curve.x += uB[j] * uP[uSpan-p+j].x;
        curve.y += uB[j] * uP[uSpan-p+j].y;
        curve.z += uB[j] * uP[uSpan-p+j].z;
    }
    // Divide by the weight
    curve.x /= curve.w;
    curve.y /= curve.w;
    curve.z /= curve.w;
    curve.w = 1.0;
    return (curve);
}
// Calculate the point on a surface mesh
vec4 spline::SurfacePoint(float u, float v)
{
    int     k, 1;
    vec4    *temp, surface;
    uFindSpan (u);
    uBasisFunction (u);
    vFindSpan (v);
    vBasisFunction (v);
    // Create temporary storage
    temp = new vec4[q+1];
    for (1=0; 1<=q; 1++)
    {
        temp[1].w = temp[1].x = temp[1].y = temp[1].z = 0.0;
        for (k=0; k<=0; k++)
        {
            temp[1].w += uB[k] * P[uSpan-p+k] [vSpan-q+1].w;
            temp[1].x += uB[k] * P[uSpan-p+k] [vSpan-q+1].x;
            temp[1].y += uB[k] * P[uSpan-p+k] [vSpan-q+1].y;
            temp[1].z += uB[k] * P[uSpan-p+k] [vSpan-q+1].z;
        }
    {
    surface.w = surface.x = surface.y = surface.z = 0.0;
    for (1=0; 1<=q; 1++)
    {
        surface.w += vB[1] * temp[1].w;
        surface.x += vB[1] * temp[1].x;
        surface.y += vB[1] * temp[1].y;
        surface.z += vB[1] * temp[1].z;
    }
    surface.x /= surface.w;
    surface.y /= surface.w;
    surface.z /= surface.w;;
    return (surface);
}
```

I wish it to be understood that I do not desire to be limited to the exact details of construction or method shown herein since obvious modifications will occur to those skilled in the relevant arts without departing from the spirit and scope of the following claims.

What is claimed is:

1. A method to create a large-area, relatively-high-resolution simulated terrain having realistic topography for use with a real-time dynamic vehicle model virtually traversing the simulated terrain and reacting thereto in conjunction with human driver inputs, the method of creating the simulated terrain database comprising:

choosing a fractal dimension for the simulated terrain;

choosing a desired magnitude for the simulated terrain in terms of a root-mean-square value;

choosing a maximum and a minimum frequency to be used in generating the simulated terrain;

accessing a relatively lower-resolution simulated terrain database wherein a three-dimensional terrain is represented by a multiplicity of joined polygons having the same size and shape;

generating an array of points in a spectral domain by using the fractal dimension, the desired magnitude and the maximum and minimum frequencies, the array in the spectral domain representing a spectral fractal Brownian surface;

wherein each point of the spectral array is defined in term of amplitude and phase, the amplitude is a random gaussian number and the phase is a random number between 0 and $2\pi$;

wherein the amplitude is multiplied by a scaling factor of $\sqrt{1/(u^2+v^2)^{H+1}}$, where the array of points in the spectral domain has a u-axis and a v-axis, the particular values for u and v at any given point are used for the scaling factor of that point, and H is a Hurst exponent;

performing low-pass filtering on the array in the spectral domain to eliminate frequencies above the maximum frequency;

performing high-pass filtering on the array in the spectral domain to eliminate frequencies below the minimum frequency;

after the high pass filtering and the low-pass filtering, transforming the array in the spectral domain into an array of points in a spatial domain, the array in the spatial domain representing a surface patch lying over an area having a same size and shape as one of the polygons of the lower-resolution terrain database performing a further filtering on the array in the spatial domain such that sides of the surface patch have a same spatial position and orientation as corresponding sides of the one polygon;

after the further filtering, designating points of the array in the spatial domain as NURBS control points;

for remaining polygons in the relatively lower-resolution simulated terrain database, repeating the steps of generating an array of points in the spectral domain, performing low-pass filtering, performing high-pass filtering, transforming, performing the further filtering, and designating the points of the array in the spatial domain as NURBS control points;

adjusting the NURBS control points in non-edge rows and columns of the spatial arrays that are adjacent to rows and columns on edges of the spatial arrays to achieve $G^1$ geometric continuity among the spatial arrays;

storing the spatial arrays in a memory;

using a computer to generate a relatively-high-resolution terrain from the spatial arrays in a zone of the simulated terrain where a vehicle represented by the dynamic model is located.

* * * * *